(12) United States Patent
Smith

(10) Patent No.: US 9,204,578 B2
(45) Date of Patent: Dec. 1, 2015

(54) SYSTEMS AND METHODS FOR COOLING DATA CENTERS AND OTHER ELECTRONIC EQUIPMENT

(75) Inventor: Kenneth Lane Smith, Gresham, OR (US)

(73) Assignee: IT Aire Inc., Portland, OR (US)

( * ) Notice: Subject to any disclaimer, the term of this patent is extended or adjusted under 35 U.S.C. 154(b) by 1034 days.

(21) Appl. No.: 13/023,346

(22) Filed: Feb. 8, 2011

(65) Prior Publication Data

US 2011/0195652 A1 Aug. 11, 2011

Related U.S. Application Data

(60) Provisional application No. 61/302,645, filed on Feb. 9, 2010.

(51) Int. Cl.
| | |
|---|---|
| H05K 7/20 | (2006.01) |
| F24F 11/00 | (2006.01) |
| G06F 1/20 | (2006.01) |
| F24F 13/08 | (2006.01) |
| F24F 13/02 | (2006.01) |
| F24F 1/00 | (2011.01) |

(52) U.S. Cl.
CPC .......... *H05K 7/20836* (2013.01); *F24F 11/008* (2013.01); *F24F 11/0012* (2013.01); *F24F 13/02* (2013.01); *F24F 13/08* (2013.01); *F24F 2001/0092* (2013.01); *F24F 2011/0041* (2013.01); *F24F 2011/0042* (2013.01); *G06F 1/20* (2013.01); *Y02B 30/545* (2013.01)

(58) Field of Classification Search
CPC .................. F24F 11/00; F24F 11/0012; F24F 2011/0041; F24F 2011/0042; F24F 13/02; F24F 13/08; G06F 1/20

USPC ............. 62/259.1, 259.2, 186, 127, 404, 407, 62/408, 419
See application file for complete search history.

(56) References Cited

U.S. PATENT DOCUMENTS

| | | | |
|---|---|---|---|
| 4,378,908 A * | 4/1983 | Wood | 237/2 B |
| 4,984,433 A | 1/1991 | Worthington | |
| 5,076,347 A | 12/1991 | Fogleman | |
| 5,664,433 A * | 9/1997 | Bourne et al. | 62/314 |
| 6,694,759 B1 * | 2/2004 | Bash et al. | 62/180 |
| 2004/0206101 A1 | 10/2004 | Bash et al. | |
| 2008/0185446 A1 * | 8/2008 | Tozer | 236/49.4 |
| 2009/0120123 A1 * | 5/2009 | Laube et al. | 62/426 |
| 2011/0238236 A1 * | 9/2011 | Tozer et al. | 700/300 |

* cited by examiner

*Primary Examiner* — Mohammad M Ali
*Assistant Examiner* — Daniel C Comings
(74) *Attorney, Agent, or Firm* — Dascenzo Intellectual Property Law, P.C.

(57) ABSTRACT

Temperature, humidity, and pressure control systems and methods for enclosed spaces, including data centers. In some embodiments, the rotational frequency of the air supply fans is controlled based on a pressure associated with the enclosed space. In some embodiments, the rotational frequency of the air supply fans is controlled based on a pressure differential between an inlet region and an exhaust region within the enclosed space. In some embodiments, air within the inlet region is segregated from air within the exhaust region. In some embodiments, the cooling capacity of the cooling equipment is controlled responsive to a temperature associated with the enclosed space. In some embodiments, the cooling capacity is controlled based on a temperature associated with the inlet region of the enclosed space. In some embodiments, the humidity within the enclosed space is controlled.

15 Claims, 10 Drawing Sheets

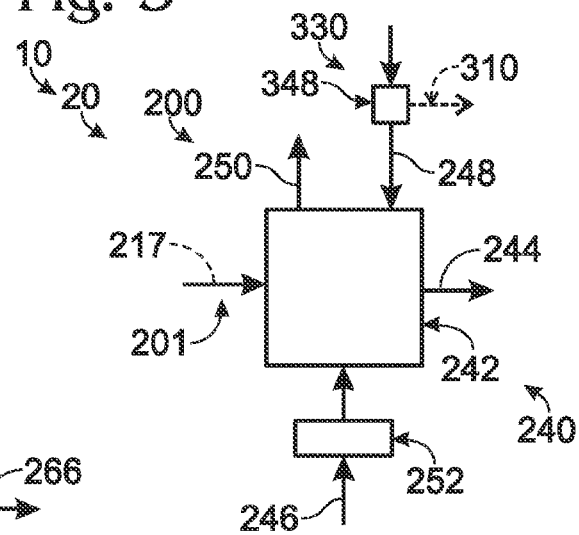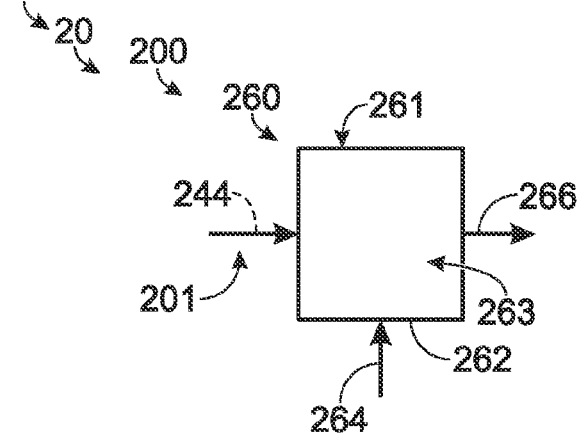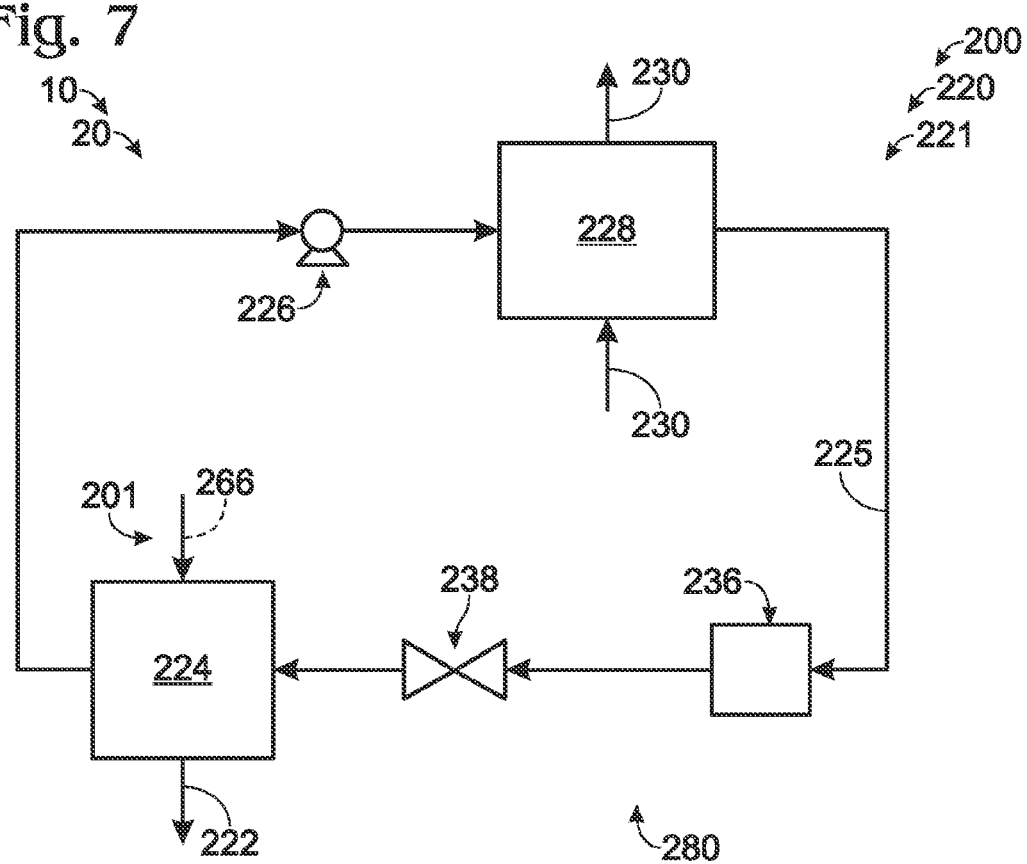

SYSTEMS AND METHODS FOR COOLING DATA CENTERS AND OTHER ELECTRONIC EQUIPMENT

RELATED APPLICATION

The present application claims priority to similarly entitled U.S. Provisional Patent Application Ser. No. 61/302,645, which was filed on Feb. 9, 2010, and the complete disclosure of which is hereby incorporated by reference.

FIELD OF THE DISCLOSURE

The present disclosure is directed generally to systems and methods to control the environment within enclosed spaces, and more specifically to systems and methods for controlling environmental variables such as temperature, pressure, and/or relative humidity in data centers and other enclosed spaces containing electronic equipment.

BACKGROUND OF THE DISCLOSURE

Semiconductor devices are electronic circuits fabricated from a semiconductor material, such as silicon. Historically, the density of these circuits has increased at a dramatic pace, doubling every 18-24 months as described by Moore's Law. This ever-increasing density of semiconductor devices is paralleled by an ever-increasing intensity of heat generated by the electronic equipment that utilizes these devices, such as printed circuit boards, servers, routers, and the like. In data centers and other locations that house large quantities of electronic equipment, cooling systems may be utilized to remove this heat. Efficient heat removal may decrease operational costs, increase equipment lifetime, and decrease equipment downtime.

Conventionally, data centers utilize rack-mounted electronic equipment. Each rack may contain forty or more individual pieces of electronic equipment, each of which utilizes electrical power to operate and generates some amount of heat while in operation. For example, each piece of electrical equipment may utilize 250 watts (W) of electrical power to operate, which means that each rack may require 10 kilowatts (KW) or more of electrical power to operate. It is not uncommon for data centers to include dozens or even hundreds of racks and to have power requirements in the megawatt (MW) range. In a conventional data center, the cooling system may comprise direct expansion air conditioning units, which may utilize as much electrical energy as the equipment that it is cooling, i.e. for every 1 KW supplied to the electronic equipment to power the equipment, another 1 KW may be needed to power the cooling system used to cool the equipment. Thus, cooling power requirements may have a significant impact on the overall energy consumption of the facility.

In addition, a direct expansion air conditioning system must be properly sized, or designed, for the heat load that it is designed to receive, such as from the electronic equipment to be cooled. Such a direct expansion air conditioning system only operates at peak efficiency when the actual heat load is at or near the design load. As additional pieces of electronic equipment are installed, such as during the build-out of a data center, the overall heat load may change significantly. In order to maintain effective cooling, the initial installation of cooling equipment may be significantly oversized, requiring it to run at reduced efficiency until the build-out nears completion, which may take months or even years. Alternatively, the cooling equipment may be installed in stages, thereby increasing incremental operating efficiency but requiring frequent and inconvenient construction. Similarly, since the ambient environment in the vicinity of the electronic equipment may fluctuate with periodic, seasonal, and/or daily temperature, pressure, and/or relative humidity fluctuations, the direct expansion air conditioning system may be sized for the maximum expected heat load based on worst-cast ambient environmental conditions, requiring it to run at a reduced efficiency level when the heat load is less than the maximum expected heat load.

With such high power requirements and built-in system inefficiencies, it may be not only costly, but also difficult, to obtain a reliable source of electricity. In addition, municipalities may place overall energy usage budgets on data centers in an effort to curb environmental impacts and ensure that power is available for other uses. Under these circumstances, any decrease in cooling power requirements may translate directly to the potential for the installation of additional electronic equipment, thereby increasing the revenue potential and/or capabilities of the data center while maintaining a substantially constant utility cost. Thus, there exists a need for higher efficiency data center cooling systems and methods that decrease the amount of energy needed for cooling while maintaining reliable operation and high efficiency over a wide cooling capacity range.

SUMMARY OF THE DISCLOSURE

The present disclosure is directed to systems and methods for controlling the environment within data centers and other enclosed spaces and to data centers and other enclosed spaces utilizing such systems and methods. These systems and methods may include independent control of a flow rate of air provided to the enclosed space by an environmental control assembly and a temperature of air provided to the enclosed space by the environmental control assembly. These systems and methods also may include controlling the relative humidity of the air within the enclosed space and/or controlling a differential pressure between the enclosed space and an ambient environment proximal to the enclosed space. The systems and methods disclosed herein may include the use of a novel fluid drive assembly.

In some embodiments, the flow rate of air provided to the enclosed space may be controlled based at least in part on a pressure measurement. In some embodiments, the pressure measurement may include one or more differential pressure measurements. In some embodiments, the one or more differential pressure measurements may include a pressure differential between a hot region, or aisle, and a cold region, or aisle, within the enclosed space. In some embodiments, the one or more differential pressure measurements may include a pressure differential between an intake region and an exhaust region within the enclosed space. In some embodiments, controlling the flow rate of air provided to the enclosed space may include controlling the rotational frequency ($\omega$) of a fluid drive assembly, such as a supply fan. In some embodiments, controlling the flow rate of air provided to the enclosed space may include controlling a number of fluid drive assemblies that are providing the air to the enclosed space.

In some embodiments, the temperature of air provided to the enclosed space may be controlled based at least in part on a temperature measurement within the enclosed space and/or the environmental control assembly. In some embodiments, this temperature measurement may include a temperature of a return air stream that is withdrawn from the enclosed space. In some embodiments, this temperature measurement may include a temperature of a supply air stream that is supplied to the enclosed space. In some embodiments, this temperature may include a temperature differential between the return air stream and the supply air stream.

Controlling the temperature of air provided to the enclosed space by the environmental control assembly may include controlling a thermal energy transfer between the air stream and the environmental control assembly. In some embodiments, this may include controlling the operation of one or more indirect evaporative coolers. In some embodiments, this may include controlling the operation of one or more direct expansion cooling assemblies. In some embodiments, this may include controlling the operation of one or more cold water cooling assemblies.

BRIEF DESCRIPTION OF THE DRAWINGS

FIG. 5 is a schematic representation of illustrative, non-exclusive examples of an indirect evaporative cooling assembly that may be utilized with the systems and methods according to the present disclosure.

FIG. 6 is a schematic representation of an illustrative, non-exclusive example of a direct evaporative humidifier assembly that may be utilized with the systems and methods according to the present disclosure.

FIG. 7 is a schematic representation of an illustrative, non-exclusive example of a supplemental direct expansion air conditioning assembly that may be utilized with the systems and methods according to the present disclosure.

DETAILED DESCRIPTION AND BEST MODE OF THE DISCLOSURE

Figure 1:
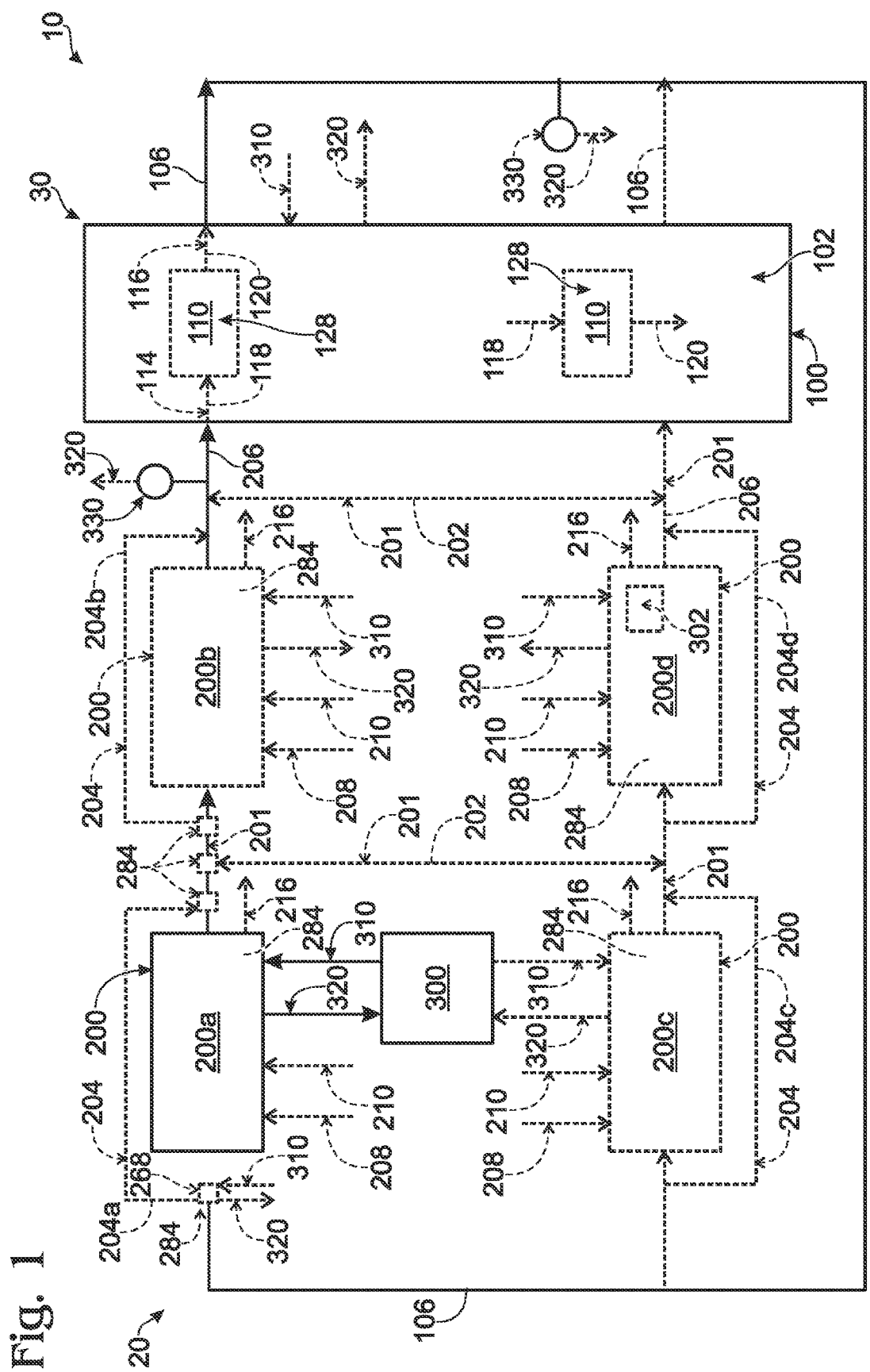
FIG. 1 is a schematic representation of illustrative, non-exclusive examples of an environmental control system according to the present disclosure.

Illustrative, non-exclusive examples of an environmental control system 10 according to the present disclosure are shown schematically in FIG. 1. Environmental control system 10 includes an environmental control assembly 20 and a space 30 to be controlled. As discussed in more detail herein, space 30 may be, or include, an enclosed space 100, which may be a data center or other space designed to house operating electrical (such as computing and/or communications) equipment. Environmental control assembly 20 receives a return air stream 106 from space 30, processes return air stream 106 as a process air stream 201 internal to the environmental control assembly, generates supply, or discharge, air stream 206, and supplies discharge air stream 206 back to space 30. In a general sense, environmental control assembly 20 may control the temperature, pressure, relative humidity, and/or other variables impacting the local environment within space 30 by processing return air stream 106 into supply air stream 206 and controlling one or more of these variables in the supply air stream.

Environmental control assembly 20 may have a rated cooling capacity that is at least as great as, or even greater than, a heat load generated by space 30 (such as by the operating electrical equipment within the space). Environmental control assembly 20 may utilize this cooling capacity to remove this heat load from space 30. Additionally or alternatively, space 30 may be described as applying an environmental load to environmental control assembly 20, such as by generating a heat load to be removed from space 30 by environmental control assembly 20. The environmental load applied by space 30 may vary with time, such as discussed herein, and environmental control assembly 20 may be adapted to detect parameters associated with this varying environmental load and to adjust its output based at least in part on the detected parameters.

Environmental control assembly 20 may comprise a plurality of air handling units (AHU) 200, with four such AHUs being indicated at 200a, 200b, 200c, and 200d, respectively. In the illustrative, non-exclusive example of FIG. 1, AHU 200a is shown connected in series to a second, optional AHU 200b (shown in dashed lines). In addition, third and fourth optional AHUs 200c and 200d, respectively, are connected in series to each other and in parallel with AHUs 200a and 200b. While four AHUs are shown in the schematic example shown in FIG. 1, it is within the scope of the present disclosure that environmental control assembly 20 may include any suitable number of AHUs arranged in series, parallel, series-parallel, and/or any other suitable configuration. Accordingly, environmental control assemblies 20 may control more than four AHUs or fewer than four AHUs without departing from the scope of the present disclosure. It is also within the scope of the present disclosure that each of the plurality of AHUs may perform separate, discrete functions and/or that two or more of the plurality of AHUs may perform the same function. It is further within the scope of the present disclosure that each of the plurality of AHUs may be housed and/or installed as separate, discrete components and/or that some, or even all, of the plurality of AHUs may be housed in a single enclosure.

Illustrative, non-exclusive examples of AHUs according to the present disclosure include extraction assemblies that are adapted to remove material from the air stream, cooling assemblies that are adapted to cool the air stream, heating assemblies that are adapted to heat the air stream, augmentation assemblies that are adapted to add material to the air stream, drive assemblies that are adapted to provide a motive force to the air stream, and/or flow control devices that are adapted to direct the flow of the air stream. Illustrative, non-exclusive examples of each of these AHU assemblies are discussed in more detail herein. While most AHUs 200 will include at least one of the preceding illustrative, non-exclusive examples of assemblies, it is within the scope of the present disclosure that an AHU 200 may not include any and/or all of these assemblies and/or that it may include one or more additional assemblies.

As shown in FIG. 1, environmental control assembly 20 further may include optional bypass conduits 204 that are adapted to bypass individual AHUs. In FIG. 1, four such bypass conduits 204 are shown and are indicated at 204*a*, 204*b*, 204*c*, and 204*d*, respectively. These bypass conduits may be contained within or external to the AHU and, when utilized, may allow at least a portion of return air stream 106 and/or process air stream 201 to bypass individual AHUs based upon one or more factors, or conditions. Illustrative, non-exclusive examples of such factors or conditions include the operational state of the AHU, the operational state of environmental control assembly 20, and/or variations in the heat load being applied to the environmental control assembly by space 30.

Illustrative, non-exclusive examples of AHU, environmental control assembly, and/or environmental control system operational states according to the present disclosure include at least an off state, a startup state, and a running, or on, state, and optionally also may include an error state, an idle state, and/or a shutdown state. As the names imply, the off state corresponds to an operational state in which the AHU, environmental control assembly, and/or environmental control system is not treating air, such as to provide cooling thereto, and the running state corresponds to an operational state in which the AHU, environmental control assembly, and/or environmental control system is treating air, such as to provide cooling thereto, and further such as to provide cooling to a space 30. Likewise, the startup and shutdown operational states correspond to operational states in which the AHU, environmental control assembly, and/or environmental control system is transitioning from an off state to a running state or from a running state to an off state, respectively. Operational states wherein the AHU is providing cooling to the air stream(s) therein may be referred to collectively as an active state. Similarly, operational states wherein the AHU is not providing cooling to the air stream(s) therein may be referred to collectively as an inactive state.

The idle operating state, when utilized or otherwise programmed or controlled to be a defined operational state of an AHU, environmental control assembly, and/or environmental control system, corresponds to an operational state in which the AHU, environmental control assembly, and/or environmental control system is primed to treat air, such as to provide cooling thereto, but is not actively changing the parameters of the air stream being treated. In essence, the idle operational state corresponds to an operational state in which the AHU, environmental control assembly, and/or environmental control system is available and ready to treat the air stream (i.e., has been started up, primed, etc. and thus is at suitable conditions to immediately transition to a running operational state to treat air).

An error state, which additionally or alternatively may be referred to as a faulted state, refers to an operational state in which a malfunction or other fault condition has been detected, such as by a sensor, controller, and/or control system of or associated with environmental control assembly 20 and/or environmental control system 10. Illustrative, non-exclusive examples of a fault condition include when one or more monitored variables are outside of an acceptable threshold value, or range of values, and when a component of the AHU, environmental control assembly, and/or environmental control system is not responding to control signals thereto and/or is not sending requested or expected output signals therefrom. When the AHU, environmental control assembly, and/or environmental control system is in an error state, it may transition to an idle or shutdown state, although it is also within the scope of the present disclosure that it may remain in the running state, as shutting down or ceasing the air treatment by the AHU, environmental control assembly, and/or environmental control system may not be desired or required responsive to all fault conditions that may result in the AHU, environmental control assembly, and/or environmental control system being in an error state. In the preceding discussion of the operating states, references to providing cooling to the treated air additionally or alternatively may refer to providing cooling to space 30 and/or enclosed space 100.

Illustrative, non-exclusive examples of variations in the heat load applied by space 30 include changes in the quantity of installed and/or operational electronic devices within the space, variations in the load, or degree of utilization, of the electronic devices within the space, variations in the physical configuration of the space, and/or variations in the level of physical isolation between the space and the ambient environment, such as might be impacted by doors, vents, or other portals that are left open or closed, the quality of the air seals between the space and the outside environment, etc. Illustrative, non-exclusive examples of other factors that may impact operation of environmental control assembly 20 include the outside air (OSA) temperature, the OSA pressure, the OSA relative humidity, and/or the cleanliness of the OSA.

In addition to return air stream 106, each AHU may receive an energy supply 208 that provides electrical, pneumatic, hydraulic, and/or other forms of potential energy to the AHU. Auxiliary stream(s) 210, such as water, chilled water, coolant, chemicals, ambient air, and/or other suitable materials also may be supplied to the AHU, and auxiliary stream(s) 216 may remove material from the AHU. In addition, each AHU may be in communication with a controller 300 that is configured, or adapted, to receive a status signal 320, which is indicative of AHU status and/or environmental variables, from the AHU and provide a control signal 310 to the AHU.

Illustrative, non-exclusive examples of AHU status signals according to the present disclosure include the operational state of the AHU, the power consumption of the AHU, and/or error or alarm status. Illustrative, non-exclusive examples of environmental variables according to the present disclosure include various pressures, temperatures, relative humidities, particulate concentrations, chemical concentrations, flow rates, voltages, currents, electrical frequencies, rotational frequencies, and/or any other variable monitored during operation of the AHU. Illustrative, non-exclusive examples of control signals according to the present disclosure include motor rotational frequency signals, on/off signals, start/stop signals, damper open/close signals, and/or any other parameter that may be controlled during the operation of environmental control assembly 20. It is within the scope of the present disclosure that one or more sensors 330 may generate one or more status signals 320 and/or may detect one or more of the environmental variables associated with supply air stream 206, return air stream 106, process air stream 201, the ambient environment proximal to the environmental control assembly, and/or any suitable component of the environmental control system, and may provide the one or more status signals to controller 300.

The environmental control assembly of FIG. 1 optionally may be configured to provide redundancy in order to decrease the potential for overall system failure should an individual component and/or series of components fail. As an illustrative, non-exclusive example, AHU 200a and AHU 200c may be adapted to perform the same or similar functions. Should an individual component, such as AHU 200a, fail, environmental control assembly 20 may be adapted to transfer the portion of return air stream 106 that was originally processed within the failed AHU to another, functional, AHU. For example, should AHU 200a fail, environmental control assembly 20 may transfer at least a portion of the return air stream that was processed within AHU 200a to AHU 200c. The environmental control assembly may then process the entire air stream exiting AHU 200c within AHU 200d. Alternatively, a portion of the air stream exiting AHU 200c may be supplied to AHU 200b through mixing stream 202. This "failure" of an AHU or other component of the environmental control assembly may refer to situations in which the AHU or other component is broken, is inoperational, is offline for maintenance, or otherwise is not available to perform its intended function.

Environmental control assembly 20 may have a rated capacity, such as a rated minimum air flow rate, a rated maximum air flow rate, a rated minimum cooling capacity, and/or a rated maximum cooling capacity. The individual components of environmental control assembly 20 may be selected such that the overall assembly may operate at or near its rated capacity despite the failure of one or more individual component, such as at 70%, 80%, 90%, or even 100% of its rated capacity. Thus, in the above illustrative, non-exclusive example, environmental control assembly 20 may continue to operate at or near its rated capacity despite the failure of an individual system component, such as AHU 200a or another AHU.

It is further within the scope of the present disclosure that environmental control assembly 20 may be adapted to continue operation while individual system components are in an off, idle, or error state and/or removed for maintenance and/or repair. Thus, in the above illustrative, non-exclusive example, the environmental control assembly may continue to supply discharge stream 206 to space 30 even though an AHU 200 has failed, is non-operational, is being maintained, is being repaired, and/or is physically removed from the environmental control assembly.

In the above discussions, environmental control assembly 20 may utilize and/or be configured to utilize any suitable flow control device 284 to direct the flow of the air streams among the various system components. Illustrative, non-exclusive examples of flow control devices according to the present disclosure include dampers 268, valves, check valves, and/or plates. Flow control devices 284 according to the present disclosure may serve and/or be configured to divert all or a portion of the air stream passing therethrough, as desired for the operation of environmental control assembly 20, and may be placed at any suitable location. The flow control devices may be actuated manually, such as by a user, and/or may be actuated automatically. If flow control devices 284 are automatically actuated, their actuation may be based upon internal sensors such as temperature, pressure, and/or flow sensors and may be electrically and/or mechanically controlled. Additionally or alternatively, the actuation of flow control devices 284 may be controlled by controller 300, such as by control signal 310. The flow control devices also may send signals to controller 300, such as status signal 320, indicative of the status of flow control device 284, such as the percentage open and/or the temperature, pressure, and/or flow rate of the air stream passing through the flow control device.

As shown in FIG. 1, and as discussed, environmental control system 10 further includes a space 30 to be controlled. Space 30 may comprise at least one enclosed space 100, such as a building, room, and/or office, and may contain equipment 110 to be cooled. When space 30 includes equipment 110, such as electronic equipment 128, printed circuit boards, servers, routers, and the like, space 30 also may be referred to as data center 102. While the disclosure contained herein may refer to space 30, enclosed space 100, and/or data center 102, it is within the scope of the present disclosure that the systems and methods disclosed herein may be utilized to control the environment of any enclosed space.

As discussed herein, data centers 102 according to the present disclosure may include equipment 110 to be cooled. Equipment 110 may receive an intake stream 118 at an intake stream temperature and discharge an exhaust stream 120 at an exhaust stream temperature. The exhaust stream temperature may be higher than the intake stream temperature. It is within the scope of the present disclosure that intake stream 118 may be received from the interior of data center 102 and that exhaust stream 120 may be exhausted into the interior of data center 102, thereby allowing mixing of the intake and exhaust streams within the data center. It is also within the scope of the present disclosure that environmental control assembly 20, space 30, enclosed space 100, and/or data center 102 may include any suitable intake conduit 114 adapted to accept intake stream 118 and supply intake stream 118 to equipment 110. It is further within the scope of the present disclosure that environmental control assembly 20, space 30, enclosed space 100, and/or data center 102 include any suitable exhaust conduit 116 adapted to accept exhaust stream 120 from equipment 110 and supply it as return air stream 106 to environmental control assembly 20. The use of intake conduit 114 and/or exhaust conduit 116 may preclude significant mixing of the intake and exhaust streams, such as which results in less than 20%, 15%, 10%, 5%, or 1% by volume mixing of the two streams. The intake and exhaust conduits may be sized for a low pressure drop at the maximum rated air flow rate of the system, such as may result in pressure drops of less than 0.25, 0.15, 0.05, 0.03, or 0.01 inch WC (water column) per one hundred feet of conduit.

Figure 2:
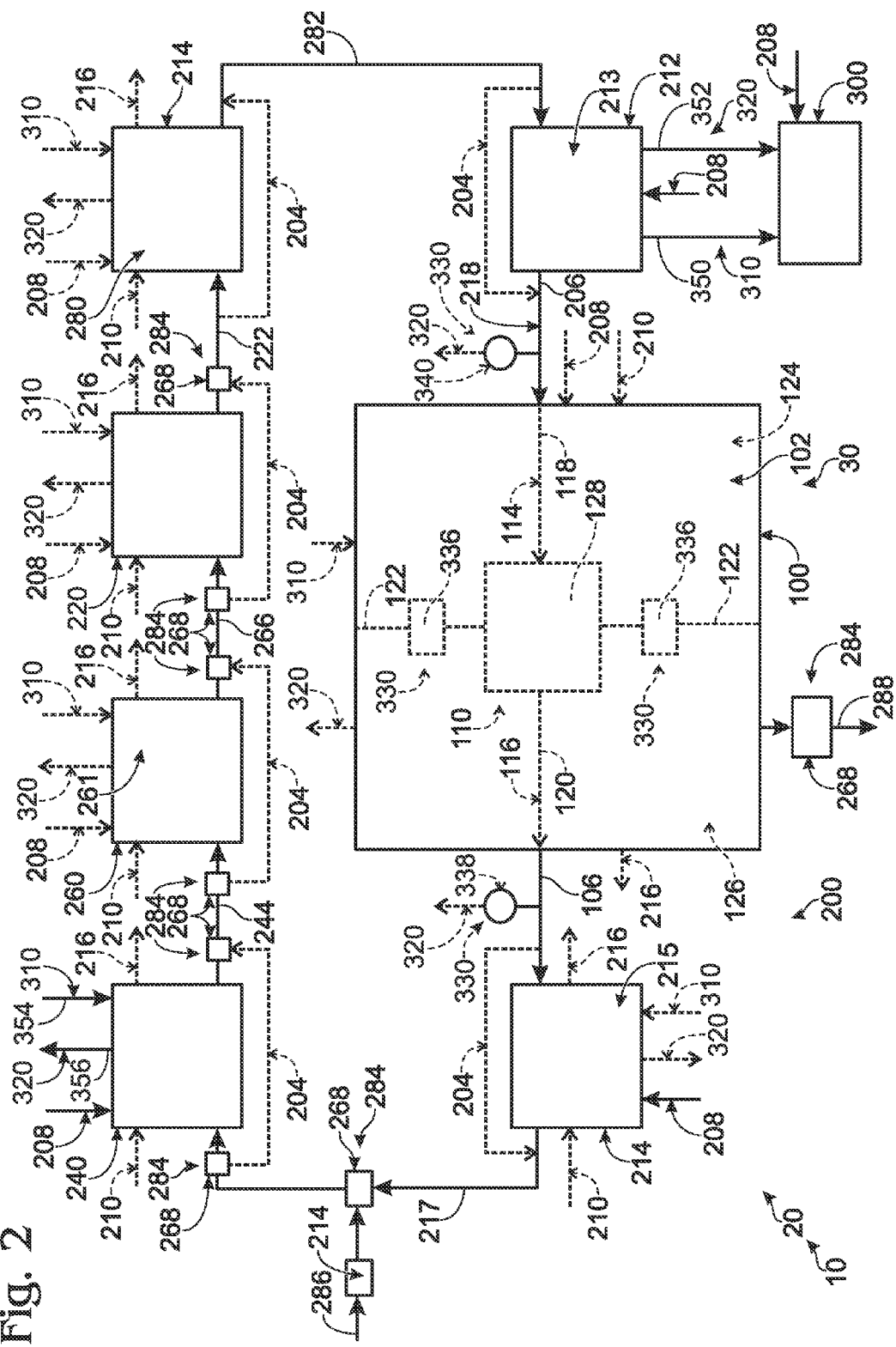
FIG. 2 is a less schematic representation of illustrative, non-exclusive examples of an environmental control system according to the present disclosure.

As discussed herein, AHUs 200 according to the present disclosure may include one or multiple elements that may be installed in a single enclosure and/or installed as separate, discrete components. Additional illustrative, non-exclusive examples of environmental control system 10 according to the present disclosure, including environmental control assembly 20, AHU 200, space 30, and enclosed space 100 are shown in FIG. 2. For the purpose of brevity, each of the previously discussed elements and/or components of the environmental control systems 10 and/or environmental control assemblies 20 of FIG. 1 will not be discussed again with respect to FIG. 2. Likewise, such elements and/or components of FIG. 2 may not be discussed again in the context of subsequent Figures. It is within the scope of the present disclosure that the previously and subsequently discussed and/or illustrated elements, components, variants, etc. may be utilized with any of the environmental control systems 10 and/or environmental control assemblies 20. The Figures of the present disclosure provide illustrative, non-exclusive graphical examples that may include additional elements and/ or components and/or which may be implemented without all of the illustrative, non-exclusive elements and/or components without departing from the scope of the present disclosure.

In FIG. 2, AHU 200 comprises a plurality of components, including an extraction assembly 214, a primary cooling assembly, such as indirect evaporative cooling assembly 240, an augmentation assembly 260, a supplemental cooling assembly 220, a second extraction assembly 214, such as dehumidifier 280, a fluid drive assembly 212, and one or more flow control devices 284. The temperature of return air stream 106 exiting space 30 may be measured by return air temperature sensor 338. Return air stream 106 may then be supplied to extraction assembly 214, such as filter 215, where a portion of the stream, such as particulate matter, may be removed, thereby creating filtered fluid stream 217 that does not include the removed portion of the return air stream. The filtered fluid stream may flow to indirect evaporative cooling (IEC) assembly 240, where the temperature of the stream may be decreased, creating IEC cooled air stream 244. The IEC cooled air stream may be supplied to augmentation assembly 260, such as humidifier 261, which may humidify the stream to create a humidified air stream 266. The humidified air stream may be supplied to supplemental cooling assembly 220, which may further decrease the temperature of the stream to create supplementally cooled air stream 222. The supplementally cooled air stream may then be supplied to dehumidifier 280, which may decrease the humidity of the stream to create dehumidified air stream 282. The dehumidified air stream may be supplied to fluid drive assembly 212, such as supply fan 213, to generate a pressurized fluid stream 218, such as supply or discharge stream 206. The temperature of supply stream 206 may be measured by supply or discharge air temperature sensor 340 before being supplied to space 30.

While FIG. 2 shows the components and streams associated with AHU 200 in a specific order, it is within the scope of the present disclosure that the individual components and streams associated with AHU 200 may be arranged in any suitable order. Individual components also may be removed, added in series with other components, duplicated, and/or added in parallel with other components without departing from the scope of the present disclosure. In addition, flow control devices 284, such as dampers 268, may be used to control the flow of the various streams within the system. For example, a damper may control the flow rate of ambient air stream 286 into, and/or the flow rate of ambient air exhaust stream 288 from, environmental control system 10. Bypass conduits 204 also may be used such that a portion of a stream may bypass one or more individual system component(s). As an illustrative, non-exclusive example, humidifier 261 may receive its inlet stream directly from filter 215 via a bypass conduit that bypasses IEC assembly 240. In addition, IEC cooled air stream 244 may bypass humidifier 260 and mix with humidified air stream 266 downstream from the humidifier. Bypass conduits may be internal or external to AHU 200 and/or the respective bypassed components.

As shown in FIG. 2, space 30 may include at least one enclosed space 100 and may include equipment 110. As discussed in more detail herein, the space may further include partitions 122 separating the space into an intake region 124 and an exhaust region 126. The space also may include one or more sensors 330, such as differential pressure sensor(s) 336, which may generate a signal representative of the pressure difference between the intake region and the exhaust region.

As shown in FIG. 2, each of the components of environmental control system 10 may receive energy supply 208. In addition, each component may receive and exhaust auxiliary streams 210 and 216, respectively. Each component also may receive a control signal 310 and/or supply a status signal 320 to controller 300. For example, fluid drive assembly 212, such as supply fan 213, may receive a control signal 310, such as supply fan rotational frequency control signal 350, from controller 300 and supply a status signal 320, such as supply fan status signal 352, to controller 300. Similarly, IEC assembly 240 may receive a control signal 310, such as IEC fan rotational frequency control signal 354, from controller 300 and supply a status signal 320, such as IEC fan status signal 356, to controller 300.

Illustrative, non-exclusive examples of temperature sensors 338 and 340 according to the present disclosure include thermocouples, resistance temperature detectors (RTDs), infrared temperature sensors, bimetallic detectors, thermistors, or any other suitable temperature measurement device. Illustrative, non-exclusive examples of filters 215 according to the present disclosure include mechanical particulate filters, electronic particulate filters, cyclonic separators, and/or chemical filters that operate on the principle of absorption, adsorption, and/or reaction. Filters 215 may be designed for low pressure drops at the maximum rated air flow rate of the system, such as pressure drops of less than 0.5, 0.3, 0.15, or 0.05 inch WC. Illustrative, non-exclusive examples of differential pressure sensors 336 according to the present disclosure include manometers, capacitive sensors, piezoresistive sensors, piezoelectric sensors, aneroid gauges, magnetic sensors, optical sensors, potentiometric sensors, resonant sensors, mass flow meters, anemometers, such as cup, windmill, rotary vane, hot wire, laser Doppler, sonic, plate, and tube, and/or any other suitable structure that generates a signal indicative of a pressure differential between two regions.

As discussed herein, space 30 and/or enclosed space 100 may include a data center 102, and may contain equipment 110, such as electronic equipment 128 to be cooled. As further discussed herein, partitions 122 may be used to separate space 30 into regions 124 that contain the intake stream and regions 126 that contain the exhaust stream.

Figure 3:
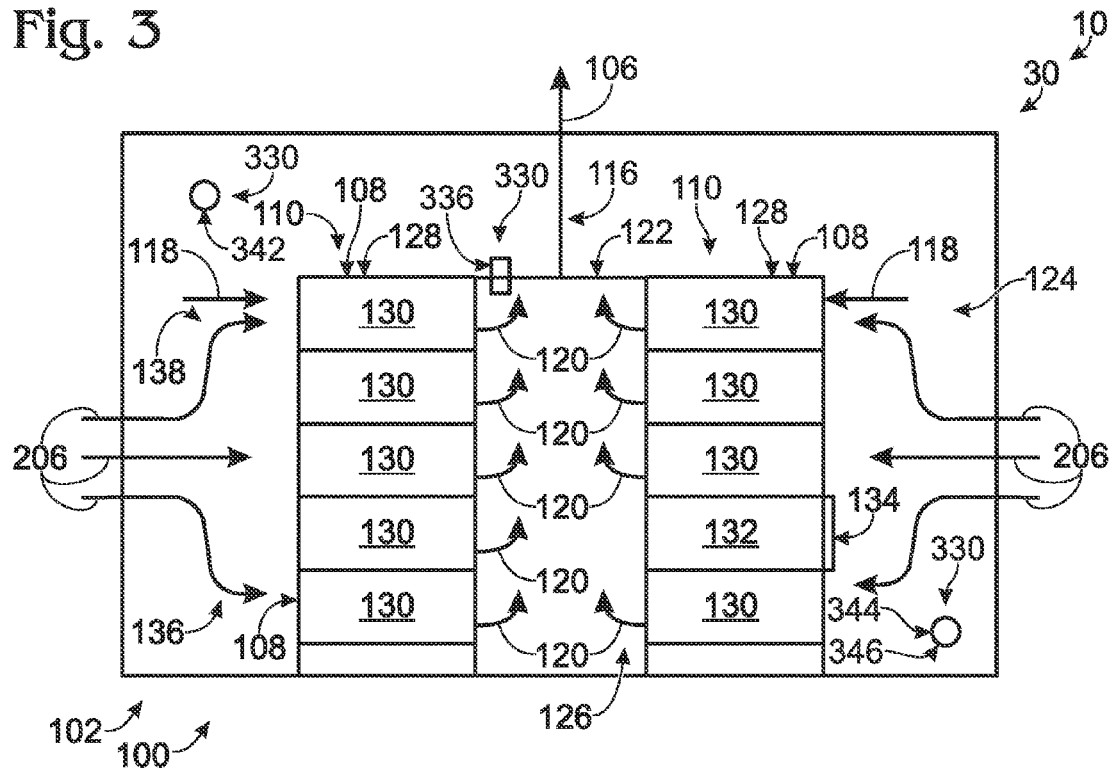
FIG. 3 is a schematic representation of an illustrative, non-exclusive example of a data center including hot aisle containment that may be utilized with the systems and methods according to the present disclosure.
Figure 4:
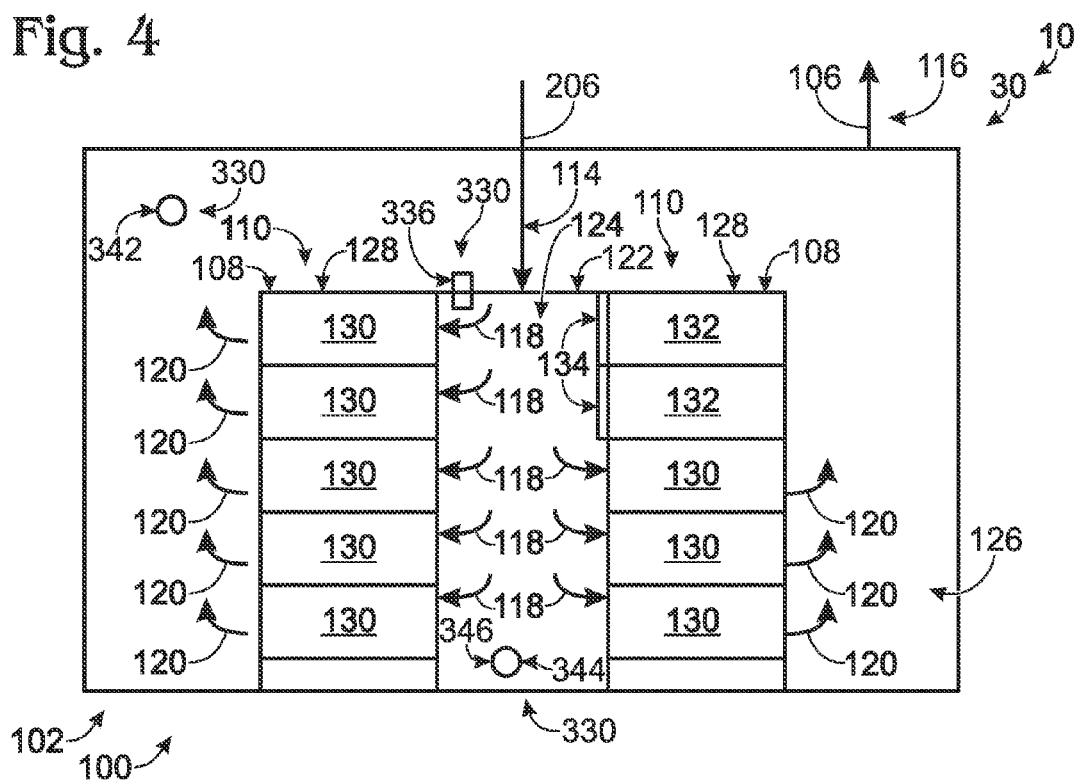
FIG. 4 is a schematic representation of an illustrative, non-exclusive example of a data center including cold aisle containment that may be utilized with the systems and methods according to the present disclosure.

Illustrative, non-exclusive examples of this regional separation are shown in FIGS. 3 and 4. FIG. 3 illustrates hot aisle containment, in which discharge air stream 206 may be supplied directly into space 30, such as to intake region 124 of data center 102, and received by equipment to be cooled 110, such as servers 130, as intake stream(s) 118. Servers 130 may be arranged within racks 108 to facilitate efficient use of space within data center 102. Fans internal to servers 130 and/or racks 108 may provide a motive force for the intake stream to flow through the servers, producing exhaust stream 120. Exhaust stream 120 may be constrained within the "hot aisle" or exhaust region 126 and flow back to environmental control assembly 20 as return air stream 106 in exhaust conduit 116.

Also shown in FIG. 3 are differential pressure sensor 336, space temperature sensor 342, cooled space temperature sensor 344, and cooled space relative humidity sensor 346. As shown in FIG. 3, air flow through electronic equipment 128 may be largely along a horizontal flow path. In addition, the air pressure within exhaust region 126 may be maintained slightly lower than the air pressure within intake region 124, such as 1.0, 0.5, 0.1, 0.05, 0.03, or 0.01 inch WC lower. Thus, there may be only minimal recirculation of exhaust stream 120 back into intake region 124, such as less than 25%, less than 15%, less than 5%, or less than 1%. Stated another way, a substantial portion of the supply air stream may pass through the electronic equipment only once before being returned to the environmental control assembly as the return air stream. As an illustrative, non-exclusive example, at least 90%, including at least 93%, at least 95%, at least 98%, or at least 99% of the supply air stream may pass through the electronic equipment only once.

This hot aisle containment may provide uniform cooling of servers 130 and may decrease variations in air temperature within intake region 124, such as differences between the temperature 136 of intake air stream 118 measured at the bottom of the server rack and the temperature 138 of intake air stream 118 measured at the top of the server rack. FIG. 3 further shows that some bays 132 in rack 108 may be empty. These empty bays may include a blanking plate 134 that is adapted to restrict the flow of air through the empty bay, thus limiting the flow of intake air 118 largely to flow through equipment 110 and decreasing the overall air flow requirements of the system. These bays refer to places, or regions, within the rack that are sized and/or configured to receive equipment 110, such as servers 130.

FIG. 4 illustrates cold aisle containment, which is similar to the hot aisle containment described with respect to FIG. 3 except that discharge air stream 206 may be supplied to the contained intake region 124 between the server racks and exhaust air stream 120 may flow into exhaust region 126 of space 30. While hot and cold aisle containment methodologies are discussed with reference to FIGS. 3 and 4, it is within the scope of the present disclosure that other air stream segregation methods may be employed. For example, environmental control systems 10 according to the present disclosure may utilize both hot and cold aisle containment simultaneously, rack-level air stream containment, such as chimney cabinets, or even equipment-level air stream containment where appropriate. While the physical segregation of air contained within intake region 124 from air contained within exhaust region 126 may be desirable, the exact segregation geometry is not critical.

As described herein, AHU 200 according to the present disclosure may include IEC assembly 240. In general, an IEC assembly utilizes a heat exchanger to transfer heat energy between a process air stream and a scavenger air stream without physical contact between the streams. The scavenger air stream is cooled by the latent heat of vaporization associated with the vaporization of a liquid stream, such as a water stream, within the scavenger air stream and may be used to cool the process stream. Thus, IEC assemblies rely on the difference between the dry bulb and the wet bulb temperature of the scavenger air stream to drive evaporation of a water stream within the scavenger air stream. In situations in which the ambient temperature is high and the wet bulb temperature is low (i.e., the relative humidity is low), IEC assemblies may be very effective at cooling a process air stream. However, the minimum attainable temperature is controlled by the dry bulb to wet bulb temperature differential, which is a function of the ambient environmental conditions of the location in which the IEC assembly is installed.

Illustrative, non-exclusive examples of an IEC assembly 240 according to the present disclosure are shown schematically in FIG. 5. In FIG. 5, IEC assembly 240 includes an IEC heat exchanger 242. An IEC fan 252 supplies an IEC scavenger air stream 246, in fluid communication with an IEC water stream 248, to the IEC heat exchanger. Water from the IEC water stream evaporates in the IEC scavenger air stream, generating a humidified IEC scavenger air stream 250 and cooling TEC heat exchanger 242. TEC heat exchanger 242 also receives a process air stream 201, such as filtered fluid stream 217 in heat exchange relationship with the heat exchanger. Filtered fluid stream 217 may be cooled by the IEC heat exchanger, which then discharges the process air stream as IEC cooled air stream 244. As also shown in FIG. 5, IEC assembly 240 may further include a sensor 330, such as IEC water flow sensor 348 that may detect the presence and/or flow rate of water to IEC assembly 240 and relay a signal 310 representative of the detected parameter to a controller, such as to controller 300 as shown in FIG. 1. IEC fan 252 may have a fixed or variable rotational frequency ($\omega$). When TEC fan 252 has a variable rotational frequency, changing the rotational frequency may change the rate at which IEC scavenger air stream 246 may be supplied to TEC heat exchanger 242 and thus the rate at which the process air stream is cooled.

AHU 200 according to the present disclosure also may include an augmentation assembly 260. In general, an augmentation assembly adds material to a process stream. This material may have any desired chemical composition and may include water, odorants, cleansers, disinfectants, bactericides, herbicides, and the like. When the augmentation assembly adds water to the process air stream, it may be called a humidifier 261. A humidifier adds water vapor to the process air stream by evaporating a water stream in the process stream. The water may be evaporated by heating and/or boiling, ultrasonication, atomization, by forcing an air stream past and/or through a water-saturated, high surface area medium, or by any other suitable method. Heating/boiling and ultrasonication require additional electrical energy to accomplish water vaporization and typically increase the temperature of the vaporized water stream. Atomization may be accomplished with or without additional electrical energy but may require a high pressure process air stream to atomize the water stream. Forced air or direct evaporative humidification may be accomplished without either a high pressure process stream or the addition of electrical energy and/or heat to the system.

An illustrative, non-exclusive example of humidifier 261 according to the present disclosure is shown in FIG. 6. Direct evaporative humidifier 261 may utilize a high surface area contact medium 263 contained within a humidifier housing 262 to provide a large contact area between a process air stream 201, such as IEC cooled air stream 244 and humidifier water stream 264, which may saturate contact medium 263. Process air stream 201 flows through humidifier housing 262 and into contact with water-saturated contact medium 263. Water from contact medium 263 may evaporate into air stream 244, generating humidified air stream 266.

If IEC assembly 240 is unable to attain the desired temperature for supply air stream 206, it may be beneficial to provide additional and/or supplemental cooling of the process air stream prior to supplying the stream to space 30. This may be accomplished through the use of supplemental cooling assembly 220. Supplemental cooling assembly 220 may take on any form suitable for decreasing the temperature of the process air stream to the desired level. This may include assemblies that rely on direct expansion of a refrigerant gas stream to provide cooling, such as a traditional air conditioning unit, assemblies that utilize a cold process fluid stream to provide cooling, and/or assemblies that utilize solid-state cooling devices to facilitate heat transfer, such as devices that rely on the Peltier effect.

An illustrative, non-exclusive example of supplemental cooling assembly 220 according to the present disclosure, in the form of direct expansion (DX) supplemental cooling system 221, is shown in FIG. 7. In FIG. 7, a refrigerant stream 225 is circulated in a closed coolant loop by a compressor 226. The refrigerant stream may be compressed by compressor 226 and then flow in thermal communication with air stream 230 within condenser 228, where it may be cooled. After compression and cooling, refrigerant stream 225 is typically a liquid stream which may pass through an optional dryer 236 to remove residual water within the coolant loop before passing through expansion, or throttle, valve 238, where the pressure is decreased and the refrigerant stream may vaporize. The refrigerant stream continues to vaporize, absorbing its latent heat of vaporization, as it passes through evaporator 224, thereby cooling the evaporator. Process air stream 201, such as humidified air stream 266, passes through evaporator 224 in thermal communication with refrigerant stream 225 and may be cooled to produce supplementally cooled air stream 222.

Figure 8:
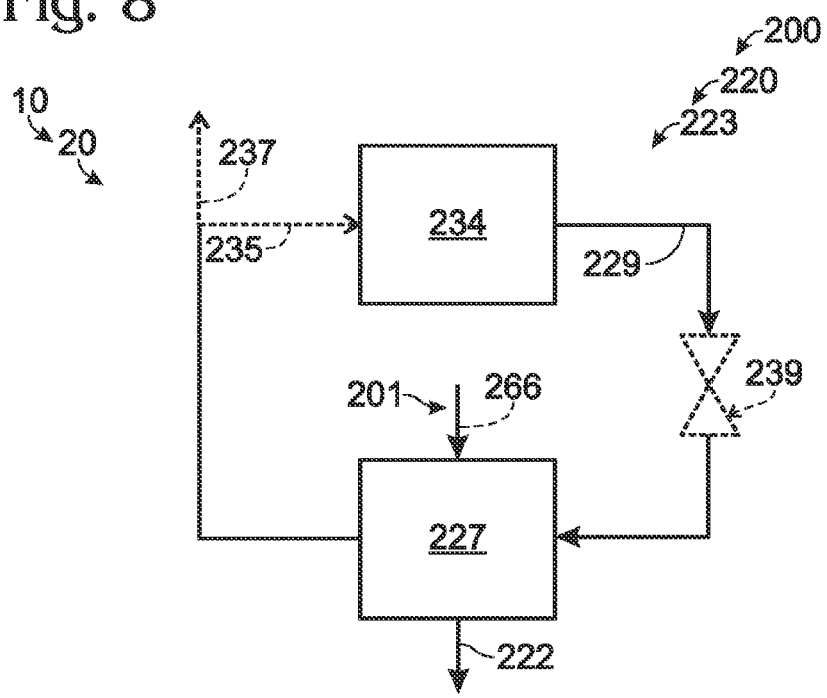
FIG. 8 is a schematic representation of illustrative, non-exclusive examples of a supplemental cold water cooling assembly that may be utilized with the systems and methods according to the present disclosure.

Additional illustrative, non-exclusive examples of supplemental cooling assembly 220 according to the present disclosure, in the form of cold water cooling assembly 223, are shown in FIG. 8. In FIG. 8, cold water 229 is supplied from a cold water source 234 to a metering valve 239 or other flow control device that controls the water flow rate. The cold water then flows to a cold water heat exchanger 227 in heat exchange relationship with process air stream 201, such as humidified air stream 266. The process air stream may be cooled within heat exchanger 227 to produce supplementally cooled air stream 222. Cold water 229 may be returned to cold water source 234 in a closed loop through cold water return line 235 and/or a portion of the cold water may be discharged through cold water discharge line 237. Illustrative, non-exclusive examples of cold water sources according to the present disclosure include a facility-supplied cold water stream that may be cooled at a different location within the facility, such as a water cooling tower and/or cold water streams obtained from a lake, river, stream, pond, well, and/or other cold water source. It is also within the scope of the present disclosure that cold water source 234 may include a pump or other device to provide the water pressure necessary to supply cold water 229 to cold water heat exchanger 227 and/or that metering valve 239 may not be included in all supplemental cooling assemblies according to the present disclosure.

As shown in previously discussed FIG. 2, an environmental control assembly 20 that includes at least one AHU 200 according to the present disclosure may further include dehumidifier 280. Dehumidifier 280 may facilitate precise control of the humidity of discharge air stream 206 by decreasing the water content, or relative humidity, of the stream, as needed. Dehumidifier 280 may be similar in structure to supplemental cooling assemblies 220 of FIGS. 7 and 8 and may utilize any mechanism utilized by the supplemental cooling assembly to condense water vapor from the stream and/or reduce the stream's relative humidity. However, the heat exchanger or evaporator utilized by dehumidifier 280 may be designed for a low sensible heat ratio, while heat exchanger 227 and evaporator 224 may be designed for a high sensible heat ratio.

Sensible heat ratio is defined as the ratio of sensible heat removed from a stream to the total heat removed from the stream. Thus, the sensible heat ratio has a value between zero and one. A low sensible heat ratio suggests that the heat exchanger or evaporator is designed to maximize the latent heat removed from the process stream (i.e., the condensation of water), while a high sensible heat ratio suggests that the heat exchanger or evaporator is designed to change the temperature of the process stream but minimize the latent heat removed from the process stream. Typically, a heat exchanger or evaporator that is designed to have a high sensible heat ratio will be relatively large and thin, thereby being designed to allow a high volume of process air to quickly pass therethrough. Likewise, a heat exchanger or evaporator that is designed to have a low sensible heat ratio typically will be relatively small and thick, thereby being designed to increase the contact time between the device and the process air stream, allowing a larger decrease in the temperature of the stream and the removal of more latent heat from the stream through water condensation. Supplemental cooling assemblies 220 according to the present disclosure may further include dampers to allow adjustment of the sensible heat ratio of any heat exchanger and/or evaporator contained therein by adjusting the flow rate of the process air stream across the heat exchanger and/or evaporator.

Figure 9:
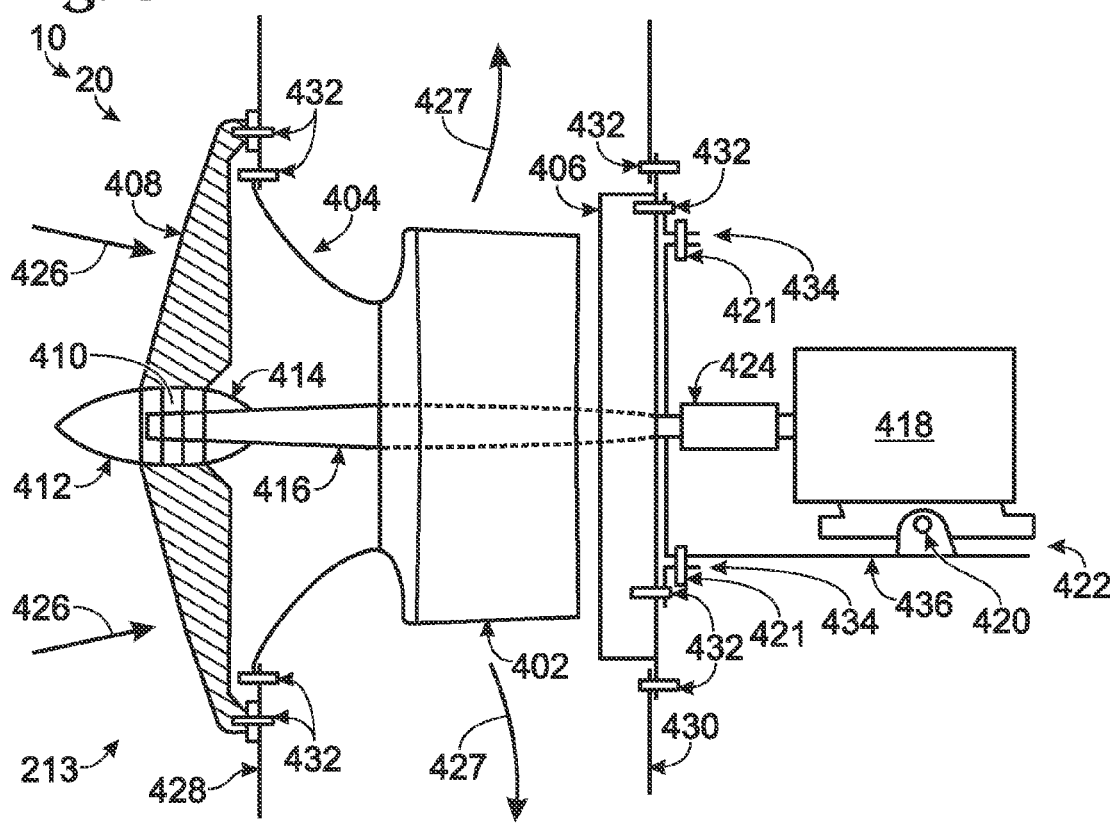
FIG. 9 is a side view of an illustrative, non-exclusive example of a supply fan assembly according to the present disclosure and which may be used with environmental control systems and methods according to the present disclosure.
Figure 10:
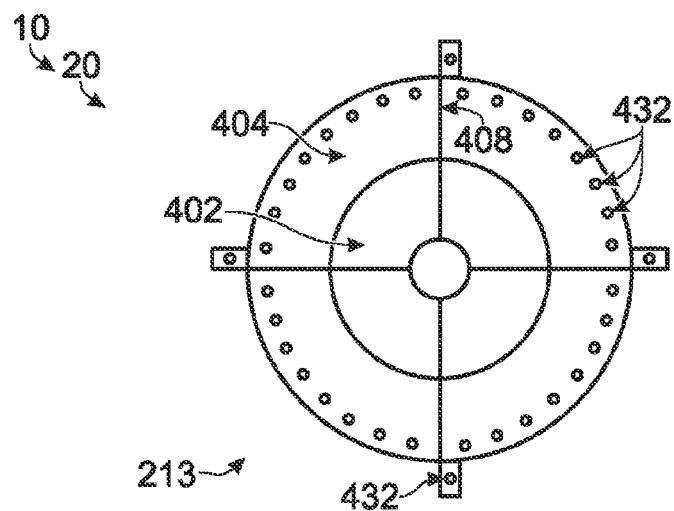
FIG. 10 is a front view of the supply fan assembly of FIG. 9.
Figure 11:
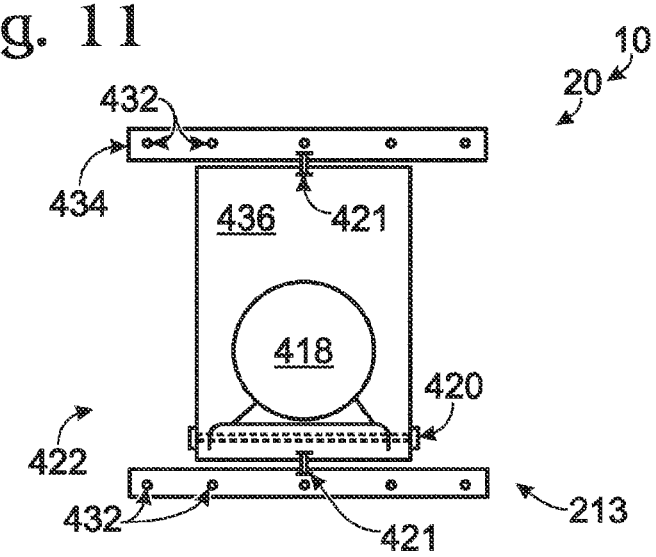
FIG. 11 is a rear view of the supply fan assembly of FIG. 9.
Figure 12:
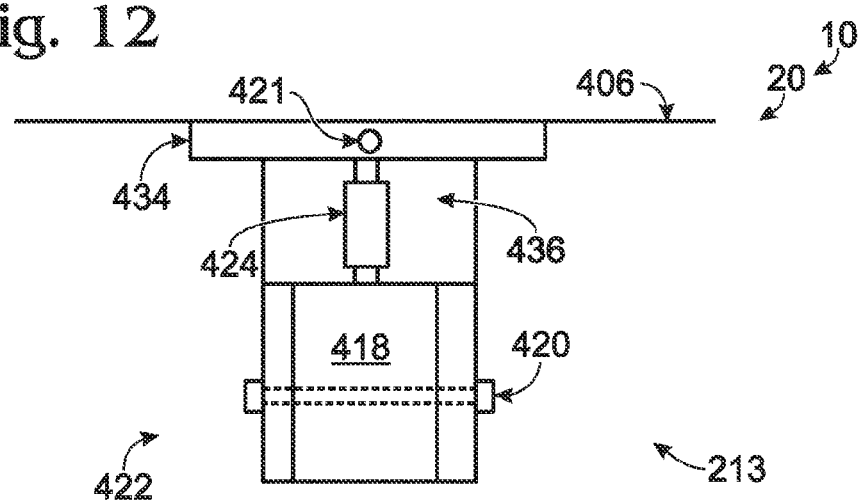
FIG. 12 is a top view of a motor mount assembly for the supply fan assembly of FIG. 9 and which may be used with other supply fan assemblies according to the present disclosure.

Fluid drive assemblies 212 according to the present disclosure may be, or include, any device designed to provide a motive force for the process air stream. Illustrative, non-exclusive examples of fluid drive assemblies 212 according to the present disclosure include supply fan 213, as well as any suitable compressor, blower, turbine, or ejector. An illustrative, non-exclusive example of supply fan 213 according to the present disclosure is shown in FIGS. 9-12. FIG. 9 represents a side view of the supply fan, FIG. 10 represents a front view of inlet cone assembly 404, FIG. 11 represents a rear view of motor mount assembly 422, and FIG. 12 represents a top view of motor mount assembly 422.

In FIGS. 9-12, a front bearing spider mount 408 is operatively attached to a spider mounting surface 428, such as by fasteners 432, and serves to retain a cartridge bearing 410. Front 412 and rear 414 cones, which may be designed or otherwise configured to improve the aerodynamic characteristics of the assembly, are mounted to a solid shaft 416 that is received by bearing 410 and extends through plenum-type wheel fan 402 to rigid shaft coupler 424. Air enters supply fan 213 at intake 426 and exits through exhaust 427. An inlet cone 404 mounted between spider mounting surface 428 and wheel fan 402 further defines the air flow path. Plug assembly 406 is operatively attached to plug assembly mounting surface 430, such as by fasteners 432, and serves to retain motor mount assembly 422 relative to the remainder of the supply fan.

Motor mount assembly 442 includes a motor mounting plate 436 that is attached with pivots 420 and 421 to motor 418 and motor mount support brackets 434. The design allows motor 418 to rotate a fixed amount about pivot 420 in the plane of FIG. 9 and about pivots 421 in the plane of FIG. 12, such as rotation of ±15°, ±10°, ±5° or ±1°. This permitted rotational motion may decrease the stress on the supply fan assembly and thereby increase its durability.

Figure 13:
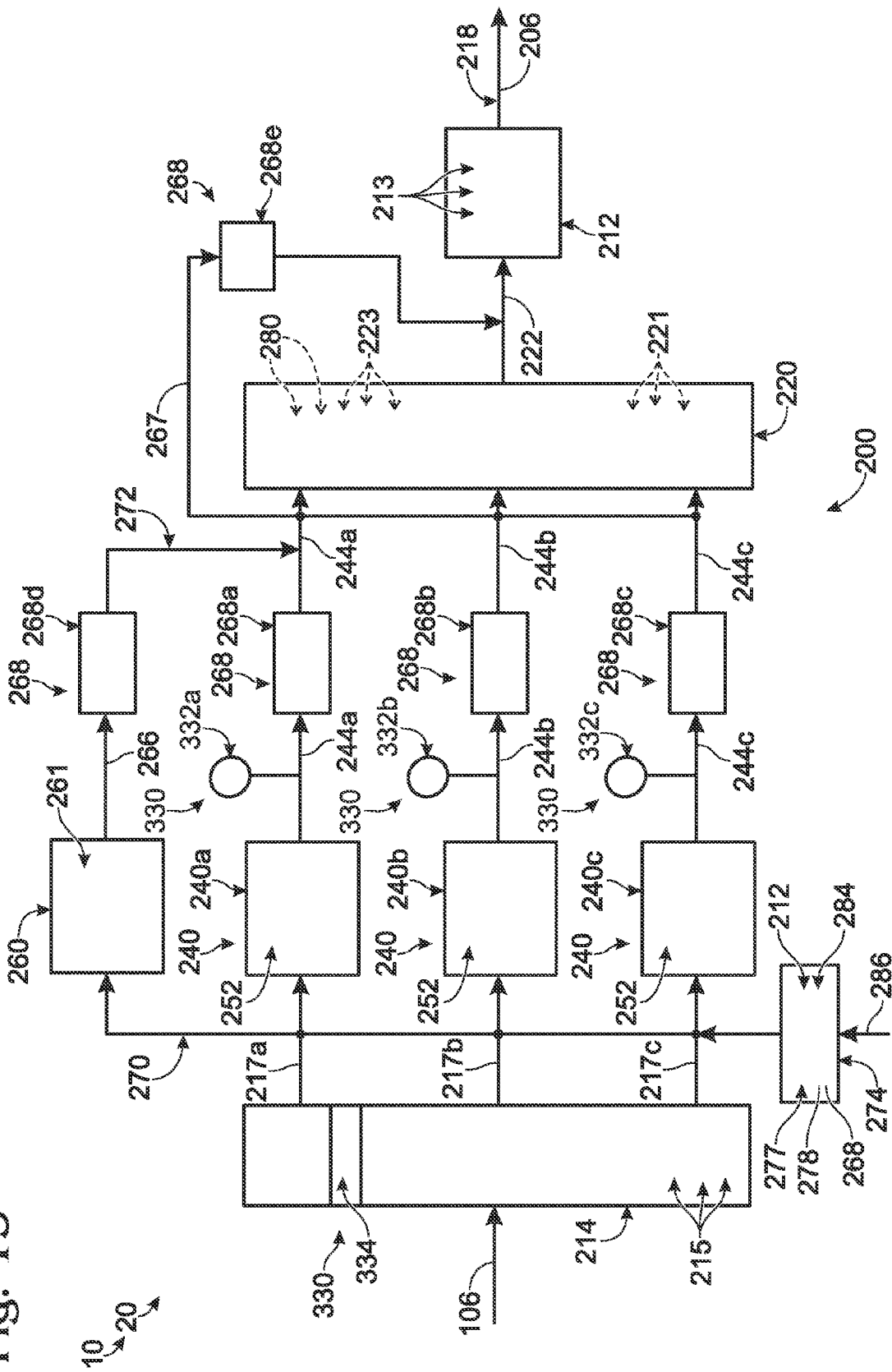
FIG. 13 is a schematic representation of illustrative, non-exclusive examples of an environmental control assembly according to the present disclosure.
Figure 14:
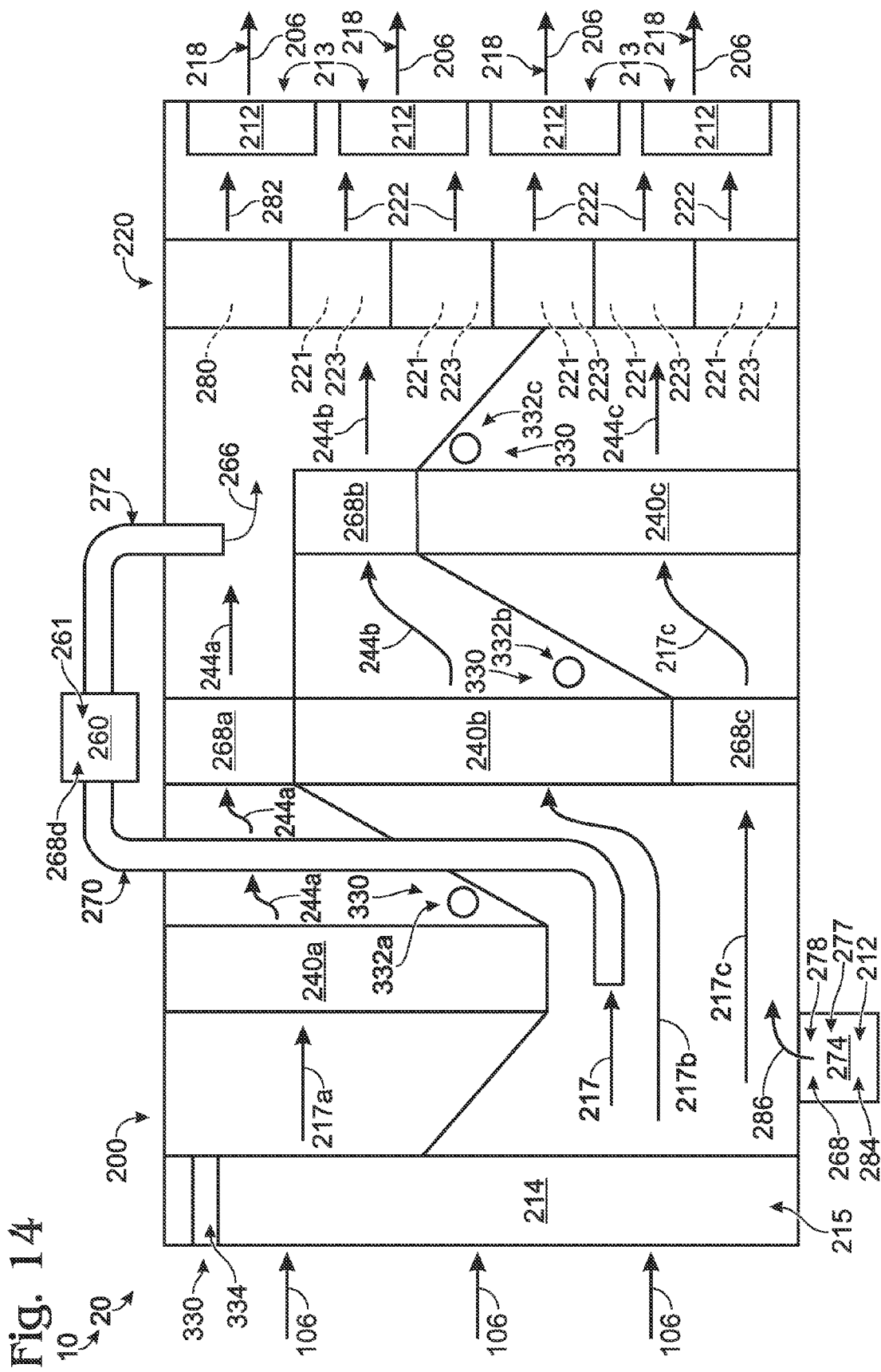
FIG. 14 is a top view of less schematic, illustrative, non-exclusive examples of an environmental control assembly according to the present disclosure.

Additional schematic, illustrative, non-exclusive examples of environmental control system 10 and environmental control assembly 20 according to the present disclosure are shown in FIG. 13, while a less schematic top view of a similar environmental control assembly is shown in FIG. 14. In FIGS. 13-14, return air stream 106 may be supplied to extraction assembly 214, such as to one or more filters 215 to produce filtered fluid streams 217a, 217b, and 217c. A sensor 330 in the form of filter differential pressure sensor 334 may monitor the pressure drop across the filters, which may be indicative of filter clogging, and may send a signal indicative of the pressure drop to controller 300 of FIG. 1.

Outside air intake 274 may include a fluid drive assembly 212, such as outside air fan 278, as well as an outside air filter 277 and a flow control device 284, such as damper 268. Ambient air stream 286 may be supplied to outside air intake 274, where it may be pressurized and filtered before mixing with filtered fluid streams 217a, 217b, and/or 217c. Flow control device 284 and/or fan 278 may control the flow of air stream 286 through outside air intake 274 and/or may prevent backflow of filtered fluid streams 217a, 217b, and/or 217c through the outside air intake.

The filtered fluid streams may be supplied along respective flow paths to IEC assemblies 240a, 240b, and 240c, to produce IEC cooled air streams 244a, 244b, and 244c, respectively. The temperatures of the IEC cooled air streams may be monitored by sensors 330 such as IEC outlet temperature sensors 332a, 332b, and 332c to ensure correct operation of the IEC assemblies. The IEC cooled air streams may then be supplied to dampers 268a, 268b, and 268c, which may control the flow rate of the process air streams through each of the three parallel paths. The IEC cooled air streams may then be supplied to supplemental cooling assembly 220, which as illustrated may comprise a plurality of direct expansion cooling assemblies 221 and/or supplemental cold water cooling assemblies 223, as well as a plurality of dehumidifiers 280. The resultant supplementally cooled air stream 222 may be supplied to fluid drive assembly 212 in the form of a plurality of supply fans 213 to produce a pressurized fluid stream 218, such as discharge air stream 206.

In addition to the three parallel air paths through IECs 240, the environmental control assembly 20 of FIGS. 13 and 14 also may include an augmentation assembly 260 in the form of a humidifier 261. A portion of the filtered fluid streams may be supplied to humidifier 261 through humidifier intake conduit 270. The portion may be humidified within humidifier 261 to form humidified air stream 266 before being supplied to damper 268d and then mixed with IEC cooled air stream 244a via humidifier exhaust conduit 272.

The system of FIGS. 13 and 14 may be designed for efficiency, flexibility, and redundancy of system components. During periods of low cooling loads, the cooling rate of the IEC assemblies may be decreased by decreasing the rotational frequency of IEC fans 252. Alternatively, individual IEC assemblies may be taken offline by stopping the IEC water stream, turning off IEC fan 252, and closing damper 268a, 268b, and/or 268c. Additionally or alternatively, individual IEC assemblies also may be taken offline in response to a failure of the IEC assembly.

Similarly, supplemental cooling assembly 220 includes a plurality of DX cooling assemblies 221 and/or cold water cooling assemblies 223 that may be turned on and off incrementally in response to the heat load placed on the system and/or failure of an individual supplemental cooling assembly. As the cooling capacity demanded from environmental control assembly 20 increases, environmental conditions change, and/or other system components are removed for maintenance, any suitable number of supplemental cooling units may be added to or removed from operation within the system. As an illustrative, non-exclusive example, supplemental cooling assembly 220 may include six five-ton direct expansion air conditioning units arranged in parallel. If operating conditions are such that eight tons of supplemental cooling are required, two direct expansion units may be turned on. As the cooling load increases, additional units may be turned on, up to the maximum number of available units. As the cooling load decreases, these supplemental cooling units may be turned off, individually or as a group. When at least one supplemental cooling assembly 220 is on, air may flow through the supplemental cooling assembly. When no supplemental cooling assemblies are on, air may bypass the supplemental cooling assembly through bypass conduit 267 as controlled by coil bank bypass damper 268e.

Likewise, fluid drive assembly 212 may include a plurality of supply fans 213. The rotational frequency of the supply fans, and thus the air flow rate, may be varied as discussed herein. Alternatively, individual supply fans may be taken offline in response to air flow needs, fan maintenance schedules, and/or fan failure. In addition, fluid drive assembly 212 and IEC assemblies 240a, 240b, and 240c may be sized to provide environmental control assembly 20 with enough excess capacity to operate at or near its rated cooling capacity despite the failure of one or more individual supply fans and/or individual IEC assemblies.

As discussed herein, the individual components of environmental control assembly 20, such as individual AHUs 200, may be arranged in any suitable configuration, including series, parallel, and/or series-parallel. In addition, any number of system components may be present. Thus, while three redundant, parallel flow paths are shown in FIGS. 13 and 14, it is within the scope of the present disclosure that environmental control assembly 20 may include more than three redundant, parallel flow paths or fewer than three paths. In addition, while FIGS. 13 and 14 show only a single augmentation assembly 260 and a single outside air intake 274, any suitable number may be utilized (including two, three, or more than three of such assemblies and/or intakes). Similarly, fluid drive assembly 212 may include any suitable number of supply fans 213 and supplemental cooling assembly 220 may include any suitable number of direct expansion and/or cold water cooling assemblies as well as any suitable number of dehumidifiers.

As discussed in more detail herein, environmental control system 10 may include a plurality of motors, fans, compressors, and/or pumps, such as motor 418, TEC fan 252, outside air fan 278, and/or refrigerant compressor 226. It is within the scope of the present disclosure that the plurality of motors may utilize any suitable source of rotational energy and that the plurality of pumps, compressors, and/or fans may be powered by any suitable source of rotational energy. Illustrative, non-exclusive examples of rotational energy sources according to the present disclosure include single phase alternating current (AC) motors, three phase AC motors, direct current (DC) motors, internal combustion engines, as well as purely mechanical rotational energy sources such as flywheels, windmills, water wheels, and the like. These rotational energy sources may be designed to have a fixed or variable rotational frequency. As an illustrative, non-exclusive example, when the rotational energy source includes a three phase AC motor, a variable frequency drive (VFD) may be utilized to control the source's rotational frequency between minimum and maximum values, such as from 10% to 200%, 20% to 150%, 30% to 125%, or 40% to 100% of the rated rotational frequency. Controller 300 may control this variable rotational frequency, which may allow the plurality of motors, fans, compressors, and/or pumps to have a variable output.

In the above discussion of environmental control system 10, the opening and closing of appropriate valves, the selection of motor and/or fan rotational frequencies, the operational position of dampers, and the control of other system hardware may be accomplished in any suitable manner utilizing any suitable mechanism. As an illustrative, non-exclusive example, this control may be implemented manually by the user, through the use of controller 300, or by a combination of the two. Controller 300 may include any suitable type and/or number of devices or mechanisms to implement and provide for the desired monitoring and/or control of the energy producing and consuming assembly. As illustrative, non-exclusive examples, a suitable controller may take the form of analog and/or digital circuitry, together with appropriate electronic instructions that may be stored on magnetic media or programmable memory such as read only memory (ROM), programmable read only memory (PROM), or erasable programmable read only memory (EPROM), and may be integrated into the environmental control system or be a separate, stand-alone computing device. The controller may be adapted or otherwise programmed or designed to control the operation of environmental control system 10 in the plurality of operating states of the system, including optionally controlling the transitions of the assembly among the various states. The controller, when present, also may include and/or be in communication with various sensors and/or status signals.

It is also within the scope of the present disclosure that the individual components of environmental control system 10, including environmental control assembly 20, may include dedicated or even integrated controllers that are adapted to monitor and/or control the operation of these components and, where applicable, control the transitions of these components among their respective operating states. As an illustrative, non-exclusive example, IEC assembly 240 may include or be in communication with a controller that is adapted to monitor and/or control the operation thereof, including configuring the assembly between its operating states.

When environmental control system 10 includes two or more controllers, the controllers may be in communication with each other. It is also within the scope of the present disclosure that the environmental control system may include a single controller that monitors and/or controls the operation of two or more components thereof, such as IEC assembly 240 and fluid drive assembly 212. A controller that is integrated into and/or otherwise specifically associated with AHU 200d is schematically indicated in FIG. 1 at 302. A system controller that may be in communication with at least AHU 200a and AHU 200c is schematically indicated in FIG. 1 at 300.

Figure 15:
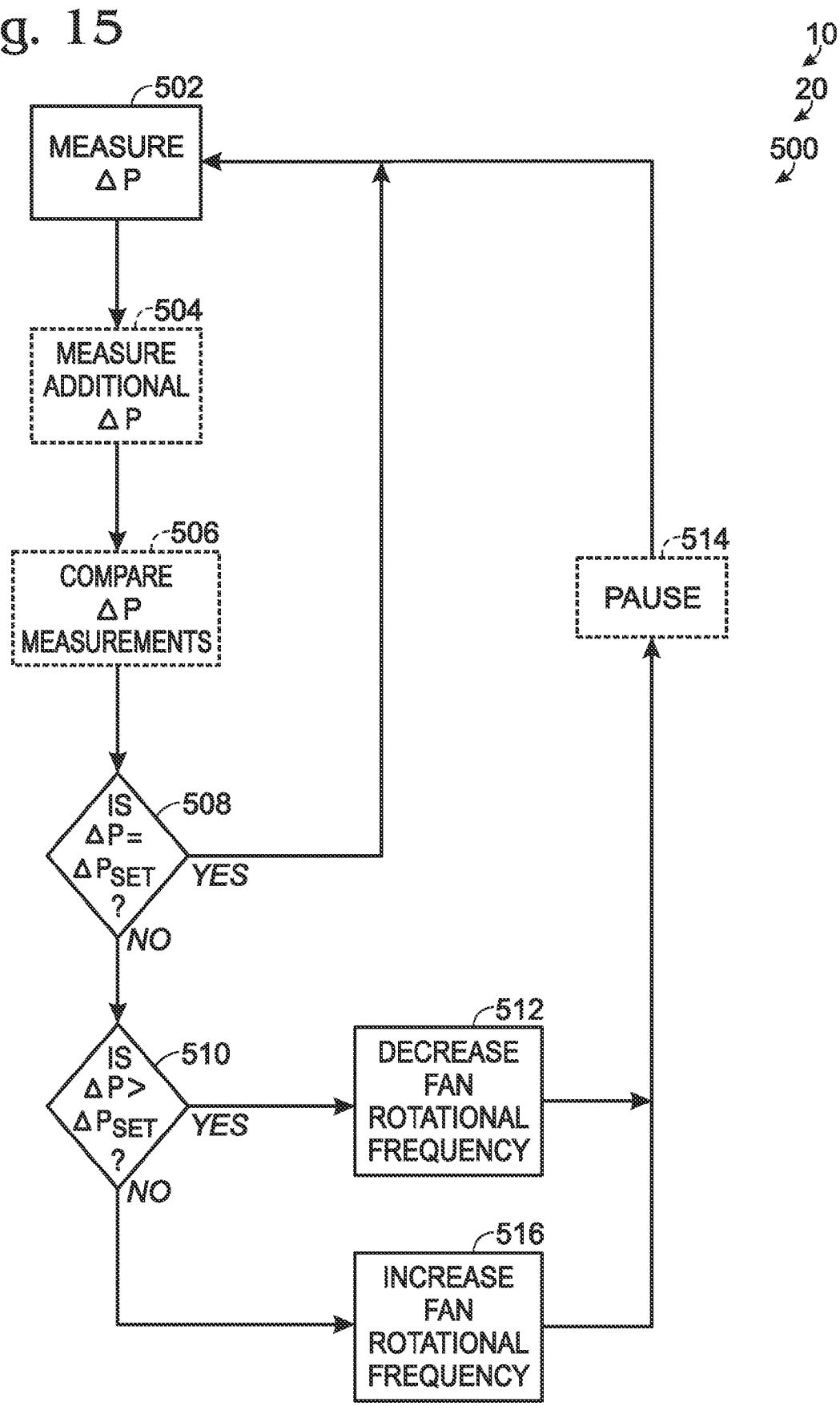
FIG. 15 is an illustrative, non-exclusive example of a flowchart depicting pressure control methods according to the present disclosure.

Illustrative, non-exclusive examples of a pressure control method 500 according to the present disclosure are shown in FIG. 15. Pressure control method 500 may be utilized to maintain a desired pressure differential between the hot and cold aisles within data center 102 by controlling the rotational frequency of supply fans 213. At 502, a differential pressure is measured between regions 124 and 126, such as by differential pressure sensor 336 of FIGS. 2-4. Optionally, additional differential pressures may be measured at 504 and the results of the plurality of differential pressure measurements compared at 506 for self-consistency to eliminate outliers that may be caused by miscalibrated, damaged, and/or non-functional differential pressure sensors.

Next, the measured differential pressure is compared to a differential pressure setpoint at 508. If the measured pressure is equal to the differential pressure setpoint and/or within a threshold pressure amount of the differential pressure setpoint, the Yes leg of the decision path is followed back to block 502, and the process is repeated. Illustrative, non-exclusive examples of differential pressure setpoints according to the present disclosure include differential pressures of 0.005 inch WC to 1.0 inch WC, including differential pressures of 0.02, 0.03, 0.04, 0.05, 0.1, and 0.25 inch WC. Illustrative, non-exclusive examples of threshold pressure amounts according to the present disclosure include amounts of 0.05 to 0.5 inch WC, including amounts of 0.01, 0.025, 0.05, and 0.1 inch WC.

If the measured differential pressure is not equal to or within a threshold pressure amount of the differential pressure setpoint, the No leg of the decision path is followed to block 510, wherein the controller determines if the measured differential pressure is greater than the differential pressure setpoint. If the measured differential pressure is greater than the differential pressure setpoint, the Yes leg is followed to block 512, where the rotational frequency of supply fans 213 within fluid drive assembly 212 is decreased by a predetermined amount. If the measured differential pressure is less than the differential pressure setpoint, the No leg is followed to block 516, where the rotational frequency of supply fans 213 within fluid drive assembly 212 is increased, such as by a predetermined increment or amount. After either a supply fan rotational frequency decrease at block 512 or increase at block 516, the controller may optionally pause for a predetermined period of time at block 514 to provide an equilibration time in which the differential pressure may stabilize before returning to block 502 and repeating the process.

The control method of FIG. 15, which may be utilized to maintain the pressure of the exhaust region slightly lower than the pressure of the intake region, may decrease backflow from the exhaust region to the intake region and is one example of a differential pressure control method according to the present disclosure. Other control strategies that vary the rotational frequency of supply fans 213 based on the difference in pressure between regions 124 and 126 may be utilized without departing from the scope of the present disclosure.

The predetermined amount by which the rotational frequency of supply fans 213 is adjusted may be a fixed value, such as a predetermined increment or a percentage of the maximum supply fan rotational frequency. Alternatively, it may be a variable value based on present operating conditions. Illustrative, non-exclusive examples of fixed values according to the present disclosure include values in the range of 0.1%-20% of the supply fans' maximum rotational frequency, such as values of 0.5%, 1%, 2%, 3%, 5%, 10%, and 15% of the supply fans' maximum rotational frequency. Illustrative, non-exclusive examples of variable values according to the present disclosure include values that are calculated based at least in part on a percentage of the supply fans' present rotational frequency and/or values that are calculated based at least in part on a magnitude of the difference between the measured differential pressure and the differential pressure setpoint. Illustrative, non-exclusive examples of predetermined periods of time according to the present disclosure include times of 0-15 minutes, including times of 1, 3, 5, 7, 9, 1-12, 2-8, 6-12, and 3-7 minutes.

Figure 16:
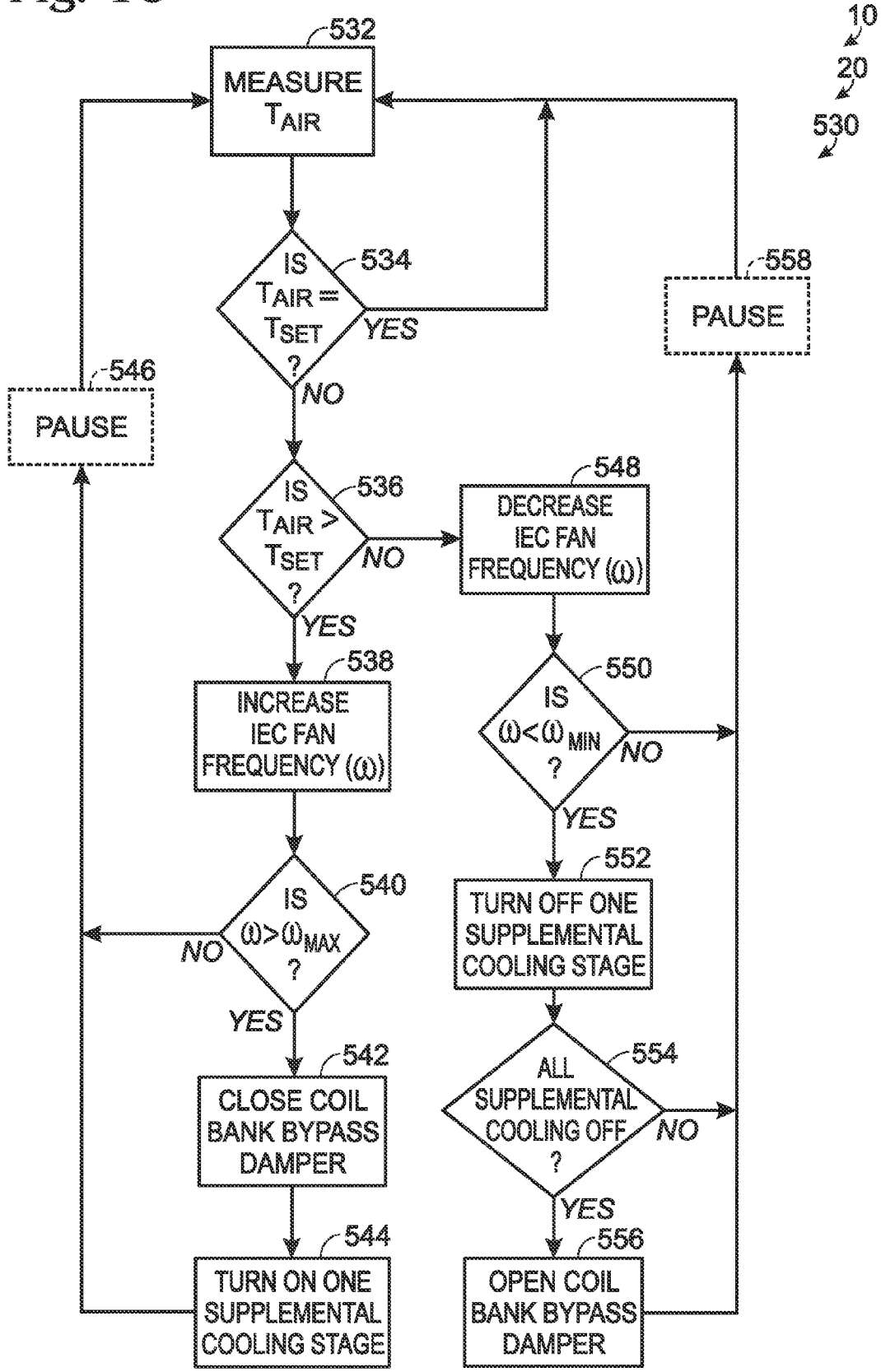
FIG. 16 is an illustrative, non-exclusive example of a flowchart depicting temperature control methods according to the present disclosure.

Illustrative, non-exclusive examples of a temperature control method 530 according to the present disclosure are shown in FIG. 16. Temperature control method 530 may be utilized in conjunction with environmental control assembly 20 to maintain the temperature of the air entering electronic equipment 128 as intake stream 118 at a desired temperature. This may be accomplished by controlling the operation of IEC assemblies 240a, 240b, and 240e as well as the operation of supplemental cooling assembly 220.

At 532, the temperature of discharge air stream 206 is measured, such as by discharge air temperature sensor 340 of FIG. 2 or by cooled space temperature sensor 344 of FIGS. 3 and 4. This measured temperature is then compared to a setpoint temperature at 534. If the measured temperature is equal to or within a threshold temperature amount of the setpoint temperature, the Yes leg is followed back to block 532 and the process is repeated. Illustrative, non-exclusive examples of temperature setpoints according to the present disclosure include temperatures in the range of 64° F. to 90° F., including temperatures of 68° F., 71° F., 74° F., 77° F., and 80° F., as well as temperatures of 70-80° F., 65-75° F., and 75-85° F. Illustrative, non-exclusive examples of threshold temperature amounts according to the present disclosure include amounts in the range 0.1° F. to 10° F., including amounts of 0.5° F., 1.0° F., 3.0° F., and 5.0° F.

If the measured temperature is not equal to or within a threshold temperature amount of the temperature setpoint, the No leg of the decision path is followed to block 536, wherein the controller determines if the measured temperature is greater than the setpoint temperature. If the measured temperature is greater than the setpoint temperature, the yes leg is followed to block 538, where the rotational frequency of IEC fans 252 is increased, such as by a predetermined amount or increment. The predetermined amount may be fixed or variable and may be calculated in a manner similar to that discussed above with reference to supply fans 213 of fluid drive assembly 212 except that the variable amounts may be calculated based at least in part on the measured temperature and/or the magnitude of the difference between the measured temperature and the setpoint temperature.

After increasing the rotational frequency of the IEC fans at block 538, the present rotational frequency of the IEC fans is compared to a predetermined upper fan rotational frequency threshold at block 540. If the present rotational frequency is greater than the predetermined upper fan rotational frequency threshold, the Yes leg is followed, wherein coil bank bypass damper 268e is closed at block 542, providing for or continuing the flow of the process air stream through the supplemental cooling coils. In addition, one additional supplemental cooling stage is turned on at block 544, and the controller may pause for a predetermined period of time at block 546 to allow for temperature stabilization before returning to block 532. If the present rotational frequency is less than the predetermined upper fan rotational frequency threshold as described above, the No leg is followed from block 540 and the controller may pause for a predetermined period of time at block 546 to provide for temperature stabilization before the method returns to block 532.

If the measured temperature is less than the temperature setpoint, the No leg is followed from block 536 to block 548, wherein the rotational frequency of the IEC fan is decreased, such as by a predetermined amount or increment, with the predetermined amount being calculated in a manner similar to that described above with reference to block 538. After decreasing the rotational frequency of the TEC fans at block 548, the present rotational frequency of the IEC fans is compared to a predetermined lower fan rotational frequency threshold at block 550. If the present rotational frequency is less than the predetermined lower fan rotational frequency threshold, the Yes leg is followed to block 552, where one supplemental cooling stage is turned off, before proceeding to block 554. At block 554, the controller determines if all supplemental cooling stages are turned off. If all supplemental cooling stages are turned off, the Yes leg is followed, coil bypass dampers 268e are opened at block 556, and the controller may pause for a predetermined period of time at block 558 to provide for temperature stabilization before returning to block 532. If all supplemental cooling stages are not turned off, the controller follows the No leg from block 554 and may pause for a predetermined period of time at block 558 to allow for temperature stabilization before returning to block 532. Alternatively, if the present rotational frequency of the IEC fans as measured at block 548 is greater than the predetermined lower fan rotational frequency threshold of block 550, the No leg is followed from block 550 and the controller pauses for a predetermined period of time at block 558 to allow for temperature stabilization before proceeding back to block 532.

Illustrative, non-exclusive examples of predetermined periods of time according to the present disclosure include times of 0-15 minutes, including times of 1, 3, 5, 7, 9, 1-12, 2-8, 6-12, and 3-7 minutes. Illustrative, non-exclusive examples of predetermined upper fan rotational frequency thresholds according to the present disclosure include upper thresholds in the range of 90% to 99% of the fans' maximum rotational frequency, such as upper thresholds of 94%, 95%, and 96% of the fans' maximum rotational frequency. Illustrative, non-exclusive examples of predetermined lower fan rotational frequency thresholds according to the present disclosure include lower thresholds in the range of 50% to 90% of the fans' maximum rotational frequency, such as lower thresholds of 60%, 65%, 70%, 75%, and 80% of the fans' maximum rotational frequency.

The control methods of FIG. 16 are illustrative, non-exclusive examples of a temperature control method that may be used according to the present disclosure. Other control strategies that vary the rotational frequency of IEC fans 252 and/or add and remove supplemental cooling stages based at least in part on a variable associated with the temperature of the air entering electronic equipment 128 are also within the scope of the present disclosure.

The systems and methods according to the present disclosure, including temperature control method 530, may be configured such that any supplemental cooling stages that are turned on may run continuously as long as the rotational frequency of the IEC fans is above the lower fan rotational frequency threshold. Under these conditions, fine control of the temperature of the process air stream may be accomplished by varying the rotational frequency of the IEC fans. This continuous running of the supplemental cooling stages, as opposed to the cyclical running that is common in many conventional environmental control systems, may increase the operational efficiency and service life of the supplemental cooling equipment.

Additional control methods may be utilized with systems according to the present disclosure. As an illustrative, non-exclusive example, and as discussed herein, environmental control assembly 20 may monitor the humidity of space 30, such as by cooled space relative humidity sensor 346, and control the relative humidity through the use of humidifier 261 and/or dehumidifier 280. The relative humidity (RH) may be controlled within a range of values, such as from 10% to 90% RH, 20% to 80% RH, 30% to 70% RH, or 40% to 60% RH, though values outside the listed ranges are also within the scope of the present disclosure. The precise humidity control range may be dictated by the equipment contained within space 30 and the desired level of protection against over drying and/or condensation within the space. When the detected RH is lower than a lower RH threshold, process air stream 201 and humidifier water stream 264 may be supplied to humidifier 261, and humidifier 261 may produce humidified air stream 266, which may increase the humidity within space 30. Conversely, when the detected RH is higher than an upper RH threshold, dehumidifier 280 may be turned on and the process air stream supplied to dehumidifier 280 to condense water from the process air stream and decrease the humidity within space 30.

As another illustrative, non-exclusive example, environmental control assembly 20, through controller 300, may control the relative pressure difference between space 30 and the outside ambient environment. This may be accomplished by controlling the rotational frequency of fan 278 associated with outside air intake 274, such that the pressure within space 30 is maintained higher than the ambient pressure, such as 0.01, 0.03, 0.05, 0.07, or 0.1 inch WC higher.

It is further within the scope of the present disclosure that the environmental control assembly may monitor the chemical composition of the air within space 30, such as the concentration of oxygen, nitrogen, carbon monoxide, carbon dioxide, other gasses, other chemical compounds, and/or other contaminants. Controller 300 may additionally control the operation of outside air intake 274 to maintain the concentration of certain gasses (oxygen, for example) above a threshold level, such as greater than 10%, 15%, or 20% by volume. Additionally or alternatively, controller 300 may control the operation of outside air intake 274 to maintain the concentration of certain gasses (carbon monoxide or carbon dioxide, for example) below a threshold level, such as less than 5%, 4%, 3%, 2%, or 1% by volume. Controller 300 may further detect the presence of smoke and/or fire within space 30 and stop the flow of air through outside air intake 274 and/or environmental control assembly 20 if a fire is detected.

These and other control methods may be performed in a priority hierarchy based on design and/or safety considerations and may be utilized independently or simultaneously. As an illustrative, non-exclusive example, control of the pressure differential between space 30 and the outside ambient environment may be the lowest priority, followed by control of the concentration of gasses and/or other materials within the air, with fire detection having the highest priority. In this example, as long as the concentration of gasses is acceptable and there is no fire, controller 300 will maintain the pressure within space 30 to be at a pressure that is higher than the ambient pressure by a threshold amount. However, if the concentration of contaminant materials in space 30 increases above a threshold value and/or the concentration of oxygen decreases below a threshold value, controller 300 may increase the flow of air through outside air intake 274, which may increase the pressure in space 30 above the threshold pressure differential. In addition, if a fire is detected within space 30, controller 300 may completely stop the flow of air thorough outside air intake 274 regardless of any other detected values and/or other control schemes.

The systems, methods, and apparatus described herein may provide independent control of the air flow rate and the cooling capacity of environmental control assembly 20. Thus, the environmental control assembly may be adapted or configured to match its cooling capacity to the heat load generated by space 30, such as by electronic equipment 128, without requiring the environmental control assembly to maintain a given air flow rate for the current cooling capacity. As an illustrative, non-exclusive example, a conventional data center may produce a heat load that requires 300-400 CFM/ton (cubic feet of air per minute per ton) of cooling capacity. However, a conventional direct expansion cooling system, such as a conventional air conditioning unit, may, by necessity of its design, be required to produce 600 to 650 CFM/ton to operate effectively and/or avoid coil icing. This additional air flow, which may be needed for optimal operation of the unit, may be wasted within space 30 and may decrease the overall efficiency of the conventional direct expansion cooling system.

In contrast, by providing independent control of air flow rate and cooling capacity, systems and methods according to the present disclosure may be adapted to match the cooling capacity of environmental control assembly 20 to the heat load of space 30, allowing the environmental control assembly to provide any suitable range of air flows and overall cooling capacity while at the same time maintaining efficient operation. As an illustrative, non-exclusive example, each supply fan 213 may be configured to supply a minimum air flow rate of 0 CFM (such as when the supply fan is in the off state) and a maximum air flow rate that is a function of the size and power requirements, as well as the rotational frequency, of the supply fan. Thus, by transitioning the various supply fans 213 associated with AHU 200 between the off and running states and/or by providing additional supply fans within the environmental control assembly, any suitable, or desired, air flow rate may be obtained. As an illustrative, non-exclusive example, and with reference to FIG. 14, AHU 200 according to the present disclosure may include four supply fans 213 and may be adapted to provide from 5,000-27,000 CFM of air flow, including 5,000-10,000, 7,500-15,000, 10,000-20,000, 10,000-25,000, 15,000-25,000, or 17,500-25,000 CFM of air flow, depending on the rotational frequency of supply fan(s) 213 and/or the number of supply fans that are currently in the running state.

Similarly, an overall cooling capacity of AHU 200 may vary from a minimum of 0 tons (such as when each of cooling assemblies 220 and 240 associated with the AHU are not providing any cooling to the air stream that flows therethrough), to a maximum that is limited only by the operational state of cooling assemblies 220 and 240 and/or by the number of cooling assemblies 220 and 240 contained within AHU 200. As an illustrative, non-exclusive example, and with continued reference to FIG. 14, AHU 200 may include three indirect evaporative cooling assemblies (240a, 240b, and 240c) as well as a plurality of supplemental cooling assemblies 220 and may be adapted to supply from 0-77 tons of cooling capacity, including 0-70, 0-60, 0-50, 0-40, 0-30, 0-20, 0-10, 10-70, or 20-50 tons of cooling capacity.

Thus, AHU 200 may be adapted to match a wide variety of heat loads, including heat loads of 50 CFM/ton, 65 CFM/ton, 100 CFM/ton, 150 CFM/ton, 200 CFM/ton, 250 CFM/ton, 300 CFM/ton, 350 CFM/ton, 400 CFM/ton, 450 CFM/ton, 500 CFM/ton, 650 CFM/ton, or more than 650 CFM/ton, as well as heat loads between 0 and 1000 CFM/ton, including heat loads of 25-500 CFM/ton, 500-1000 CFM/ton, 250-750 CFM/ton, 50-600 CFM/ton, 75-450 CFM/ton, 100-400 CFM/ton, 100-300 CFM/ton, or 100-250 CFM/ton. In addition, and as discussed herein, environmental control assembly 20 may be comprised of any suitable number of AHUs 200. Thus, the upper limit to the cooling capacity may be limited only by the number of installed systems.

In the illustrative, non-exclusive examples of environmental control systems and/or individual components thereof disclosed herein, the fluid drive assemblies that may provide the motive force for fluid flow through the various components of the environmental control system have been illustrated at specific locations within the environmental control systems and/or within the individual components. However, it is within the scope of the present disclosure that these fluid drive assemblies may be included at any suitable location within the environmental control system. As an illustrative, non-exclusive example, and with reference to FIG. 2, fluid drive assembly 212, such as supply fan 213, is shown downstream of humidifier 280 and upstream of enclosed space 100 such that the supply fan draws dehumidified air stream 282 from dehumidifier 280 and provides pressurized fluid stream 218 to enclosed space 100. However, it is within the scope of the present disclosure that supply fan 213 may additionally or alternatively be located downstream of enclosed space 100, between enclosed space 100 and filter 215, between filter 215 and damper 268, between damper 268 and TEC assembly 240, between TEC assembly 240 and humidifier 261, between humidifier 261 and supplemental cooling assembly 220, and/or between supplemental cooling assembly 220 and dehumidifier 280. As another illustrative, non-exclusive example, and with reference to FIG. 5, IEC fan 252 is shown upstream of IEC heat exchanger 242 such that it provides IEC scavenger air stream 246 to IEC heat exchanger 242. However, it is also within the scope of the present disclosure that IEC fan 252 may be located downstream of TEC heat exchanger 242 such that it draws TEC humidified scavenger air stream 250 from TEC heat exchanger 242.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any of the references that are incorporated by reference herein define a term in a manner or are otherwise inconsistent with either the non-incorporated portion of the present disclosure or with any of the other incorporated references, the non-incorporated portion of the present disclosure shall control, and the term or incorporated disclosure therein shall only control with respect to the reference in which the term is defined and/or the incorporated disclosure was originally present.

As used herein the terms "adapted" and "configured" mean that the element, component, or other subject matter component is designed and/or intended to perform a given function. Thus, the use of the terms "adapted" and "configured" should not be construed to mean that a given element, component, or other subject matter is simply "capable of" performing a given function but that the element, component, and/or other subject matter is specifically created for the purpose of performing the function. It is also within the scope of the present disclosure that elements, components, and/or other recited subject matter that is recited as being adapted to perform a particular function may additionally or alternatively be described as being configured to perform that function, and vice versa.

Illustrative, non-exclusive examples of systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. An environmental control assembly configured to provide a supply air stream to an enclosed space, to control at least one characteristic of the supply air stream, and to receive a return air stream from the enclosed space, the environmental control assembly comprising:

a fluid drive assembly configured to provide a motive force to the supply air stream, wherein the fluid drive assembly is configured to vary a flow rate of the supply air stream;

a primary cooling assembly;

a supplemental cooling assembly; and a controller, wherein the controller includes a pressure control portion and a temperature control portion;

wherein the pressure control portion is configured to control operation of the fluid drive assembly based at least in part on a pressure associated with the enclosed space;

wherein the temperature control portion is configured to control operation of at least one of the primary cooling assembly and the supplemental cooling assembly based at least in part on a temperature associated with the enclosed space; and further wherein the pressure control portion is independent of the temperature control portion, A2. The environmental control assembly of paragraph A1, wherein the enclosed space includes a hot aisle and a cold aisle, and further wherein the pressure associated with the enclosed space includes a pressure differential between the hot aisle and the cold aisle.

A3. The environmental control assembly of paragraph A2, wherein the pressure control portion is configured to maintain an air pressure in the hot aisle to be less than an air pressure in the cold aisle.

A4. The environmental control assembly of any of paragraphs A1-A3, wherein the pressure control portion is configured to control the fluid drive assembly to increase the flow rate of the supply air stream responsive at least in part to the pressure associated with the enclosed space being less than a threshold magnitude.

A5. The environmental control assembly of any of paragraphs A1-A4, wherein the pressure control portion is configured to control the fluid drive assembly to decrease the flow rate of the supply air stream responsive at least in part to the pressure associated with the enclosed space being greater than a threshold magnitude.

A6. The environmental control assembly of any of paragraphs A4-A5, wherein the fluid drive assembly includes a variable rotational frequency fluid drive fan, wherein increasing the flow rate of the supply air stream includes increasing a rotational frequency of the variable rotational frequency fluid drive fan, and further wherein decreasing the flow rate of the supply air stream includes decreasing the rotational frequency of the variable rotational frequency fluid drive fan.

A7. The environmental control assembly of any of paragraphs A1-A6, wherein the primary cooling assembly includes an indirect evaporative cooling assembly (IECA), wherein the IECA includes an IECA fan, and further wherein the IECA fan includes a variable rotational frequency IECA fan.

A8. The environmental control assembly of paragraph A7, wherein the temperature control portion is configured to increase a rotational frequency of the variable rotational frequency IECA fan responsive at least in part to the temperature associated with the enclosed space being greater than a threshold magnitude.

A9. The environmental control assembly of paragraph A8, wherein the temperature control portion is configured to decrease the rotational frequency of the variable rotational frequency IECA fan responsive at least in part to the temperature associated with the enclosed space being less than a threshold magnitude.

A10. The environmental control assembly of paragraph A8, wherein the IECA is a first IECA that includes a first variable rotational frequency IECA fan, wherein the environmental control assembly includes a second IECA that includes a second variable rotational frequency IECA fan, and further wherein, the temperature control portion is configured to at least one of transition the second IECA from an inactive state to an active state and increase a rotational frequency of the second variable rotational frequency IECA fan responsive at least in part to the rotational frequency of the first variable rotational frequency IECA fan being greater than an IECA fan maximum rotational frequency threshold.

A11. The environmental control assembly of paragraph A10, wherein the temperature control portion is configured to at least one of transition the second IECA from the active state to the inactive state and decrease the rotational frequency of the second variable rotational frequency IECA fan responsive at least in part to the rotational frequency of the first variable rotational frequency IECA fan being less than an IECA fan minimum rotational frequency threshold.

A12. The environmental control assembly of any of paragraphs A1-A9, wherein the supplemental cooling assembly includes at least one of a direct expansion cooling assembly and a cold water cooling assembly.

A13. The environmental control assembly of any of paragraphs A1-A10, wherein the supplemental cooling assembly includes a plurality of supplemental cooling assemblies including at least a first supplemental cooling assembly and at least a second supplemental cooling assembly.

A14. The environmental control assembly of paragraph A13, wherein the temperature control portion is configured to transition the first supplemental cooling assembly from a supplemental cooling assembly inactive state to a supplemental cooling assembly active state responsive at least in part to the rotational frequency of the variable rotational frequency IECA fan being greater than the IECA fan maximum rotational frequency threshold.

A15. The environmental control assembly of paragraph A14, wherein the temperature control portion is configured to transition the second supplemental cooling assembly from the supplemental cooling assembly inactive state to the supplemental cooling assembly active state responsive at least in part to the first supplemental cooling assembly being in the supplemental cooling assembly active state and the rotational frequency of the variable rotational frequency IECA fan being greater than the IECA fan maximum rotational frequency threshold.

A16. The environmental control assembly of paragraph A13, wherein the temperature control portion is configured to transition the second supplemental cooling assembly from a supplemental cooling assembly active state to a supplemental cooling assembly inactive state responsive at least in part to the first supplemental cooling assembly being in the supplemental cooling assembly active state and the rotational frequency of the variable rotational frequency IECA fan being less than the IECA fan minimum rotational frequency threshold.

A17. The environmental control assembly of paragraph A16, wherein the temperature control portion is configured to transition the first supplemental cooling assembly from the supplemental cooling assembly active state to the supplemental cooling assembly inactive state responsive at least in part to the second supplemental cooling assembly being in the supplemental cooling assembly inactive state and the rotational frequency of the IECA fan being less than the IECA fan minimum rotational frequency threshold.

A18. The environmental control assembly of any of paragraphs A1-A17, wherein the flow rate of supply air provided to the enclosed space is between 5,000 and 27,000 cubic feet per minute (CFM).

A19. The environmental control assembly of any of paragraphs A1-A18, wherein the environmental control assembly is configured to supply between 0 and 77 tons of cooling capacity to the enclosed space.

A20. The environmental control assembly of any of paragraphs A1-A19, wherein the enclosed space includes a data center.

A21. The environmental control assembly of paragraph A20, wherein the data center includes electronic equipment, and further wherein at least a substantial portion of the supply air stream passes through the electronic equipment only once before returning to the environmental control assembly as the return air stream.

A22. The environmental control assembly of any of paragraphs A1-A21, wherein the environmental control assembly further includes an augmentation assembly.

A23. The environmental control assembly of paragraph A22, wherein the augmentation assembly includes a humidifier.

A24. The environmental control assembly of any of paragraphs A1-A23, wherein the environmental control assembly further includes an extraction assembly.

A25. The environmental control assembly of paragraph A24, wherein the extraction assembly includes at least one of a dehumidifier and a filter.

A26. The environmental control assembly of any of paragraphs A1-A25, wherein the temperature associated with the enclosed space includes at least one of a temperature of the supply air stream and a temperature of the return air stream.

B1. An environmental control assembly configured to provide a supply air stream to an enclosed space, to control at least one characteristic of the supply air stream, and to receive a return air stream from the enclosed space, the environmental control assembly comprising:

a fluid drive assembly configured to provide a motive force to the supply air stream, wherein the fluid drive assembly is configured to vary a flow rate of the supply air stream;

a primary cooling assembly;

a supplemental cooling assembly; and a controller, wherein the controller includes a pressure control portion and a temperature control portion;

wherein the pressure control portion is configured to control operation of the fluid drive assembly based at least in part on a pressure associated with the enclosed space, wherein the enclosed space includes a hot aisle and a cold aisle, wherein the pressure associated with the enclosed space includes a pressure differential between the hot aisle and the cold aisle, and further wherein the pressure within the hot aisle is less than the pressure within the cold aisle; and wherein the temperature control portion is configured to control operation of at least one of the primary cooling assembly and the supplemental cooling assembly based at least in part on a temperature associated with the enclosed space.

C1. A method of controlling the environment within an enclosed space, the method comprising:

supplying a supply air stream from an environmental control assembly to the enclosed space;

returning at least a portion of the supply air stream that was supplied to the enclosed space to the environmental control assembly as a return air stream;

controlling a temperature of the supply air stream with the environmental control assembly based at least in part on a first variable associated with the enclosed space; and controlling a flow rate of the supply air stream with the environmental control assembly based at least in part on a second variable associated with the enclosed space.

C2. The method of paragraph C1, wherein the first variable associated with the enclosed space is different from the second variable associated with the enclosed space.

C3. The method of any of paragraphs C1-C2, wherein the first variable associated with the enclosed space includes a temperature associated with the enclosed space.

C4. The method of paragraph C3, wherein the temperature associated with the enclosed space includes at least one of a temperature of the supply air stream and a temperature of the return air stream.

C5. The method of any of paragraphs C1-C4, wherein the second variable associated with the enclosed space includes a pressure associated with the enclosed space.

C6. The method of paragraph C5, wherein the enclosed space includes a hot aisle and a cold aisle, and further wherein the pressure associated with the enclosed space includes a pressure differential between the hot aisle and the cold aisle.

C7. The method of paragraph C6, wherein the method further includes maintaining an air pressure in the hot aisle to be less than an air pressure in the cold aisle.

C8. The method of paragraph C7, wherein the method further includes utilizing hot aisle containment.

C9. The method of any of paragraphs C1-C8, wherein controlling the temperature of the supply air stream and controlling the flow rate of the supply air stream includes controlling the temperature of the supply air stream independently from controlling the flow rate of the supply air stream.

C10. The method of paragraph C9, wherein controlling the temperature of the supply air stream independently from controlling the flow rate of the supply air stream includes controlling the temperature of the supply air stream without varying the flow rate of the supply air stream.

C11. The method of paragraph C9, wherein controlling the temperature of the supply air stream independently from controlling the flow rate of the supply air stream includes controlling the flow rate of the supply air stream without varying the temperature of the supply air stream.

C12. The method of any of paragraphs C1-C11, wherein the environmental control assembly includes an indirect evaporative cooling assembly (IECA) that includes a variable rotational frequency IECA fan, and further wherein controlling the temperature of the supply air stream includes controlling a rotational frequency of the variable rotational frequency IECA fan.

C13. The method of paragraph C12, wherein the method further includes increasing the rotational frequency of the variable rotational frequency IECA fan responsive at least in part to the first variable associated with the enclosed space being greater than a threshold magnitude.

C14. The method of paragraph C13, wherein the method further includes decreasing the rotational frequency of the variable rotational frequency IECA fan responsive to the first variable associated with the enclosed space being less than a threshold magnitude.

C15. The method of paragraph C14, wherein the IECA is a first IECA including a first variable rotational frequency IECA fan, wherein the environmental control assembly includes a second IECA including a second variable rotational frequency IECA fan, and further wherein controlling the temperature of the supply air stream includes at least one of transitioning the second IECA from an inactive state to an active state and increasing the rotational frequency of the second variable rotational frequency IECA fan responsive at least in part to the rotational frequency of the first variable rotational frequency IECA fan being greater than an IECA fan maximum rotational frequency threshold.

C16. The method of paragraph C15, wherein controlling the temperature of the supply air stream includes at least one of transitioning the second IECA from the active state to the inactive state and decreasing the rotational frequency of the second variable rotational frequency IECA fan responsive at least in part to the rotational frequency of the first variable rotational frequency IECA fan being less than an IECA fan minimum rotational frequency threshold.

C17. The method of paragraph C12, wherein the environmental control assembly further includes a supplemental cooling assembly, wherein the supplemental cooling assembly includes at least one of a direct expansion cooling assembly and a cold water cooling assembly, and further wherein controlling the temperature of the supply air stream includes controlling the operation of the supplemental cooling assembly.

C18. The method of paragraph C17, wherein the supplemental cooling assembly includes a plurality of supplemental cooling assemblies including at least a first supplemental cooling assembly and at least a second supplemental cooling assembly, and further wherein controlling the temperature of the supply air stream includes transitioning the first supplemental cooling assembly from a supplemental cooling assembly inactive state to a supplemental cooling assembly active state responsive at least in part to the rotational frequency of the variable rotational frequency IECA fan being greater than the IECA fan maximum rotational frequency threshold.

C19. The method of paragraph C18, wherein controlling the temperature of the supply air stream includes transitioning the second supplemental cooling assembly from the supplemental cooling assembly inactive state to the supplemental cooling assembly active state responsive at least in part to the first supplemental cooling assembly being in the supplemental cooling assembly active state and the rotational frequency of the variable rotational frequency IECA fan being greater than the IECA fan maximum rotational frequency threshold.

C20. The method of paragraph C19, wherein controlling the temperature of the supply air stream includes transitioning the second supplemental cooling assembly from the supplemental cooling assembly active state to the supplemental cooling assembly inactive state responsive at least in part to the first supplemental cooling assembly being in the supplemental cooling assembly active state and the rotational frequency of the variable rotational frequency IECA fan being less than the IECA fan minimum rotational frequency threshold.

C21. The method of paragraph C20, wherein controlling the temperature of the supply air stream includes transitioning the first supplemental cooling assembly from the supplemental cooling assembly active state to the supplemental cooling assembly inactive state responsive at least in part to the second supplemental cooling assembly being in the supplemental cooling assembly inactive state and the rotational frequency of the variable rotational frequency IECA fan being less than the IECA fan minimum rotational frequency threshold.

C22. The method of any of paragraphs C11-C21, wherein controlling the flow rate of the supply air stream includes increasing the flow rate of the air supply stream responsive at least in part to the second variable associated with the enclosed space being less than a threshold magnitude.

C23. The method of paragraph C22, wherein controlling the flow rate of the supply air stream includes decreasing the flow rate of the air supply stream responsive at least in part to the second variable associated with the enclosed space being greater than the threshold magnitude.

C24. The method of paragraph C23, wherein the environmental control assembly includes a variable rotational frequency fluid drive assembly configured to provide a motive force to the supply air stream, wherein increasing the flow rate of the supply air stream includes increasing a rotational frequency of the variable rotational frequency fluid drive assembly, and further wherein decreasing the flow rate of the supply air stream includes decreasing the rotational frequency of the variable rotational frequency fluid drive assembly.

C25. An environmental control assembly, comprising:
a fluid drive assembly configured to control the flow rate of the supply air;
a cooling assembly configured to control the temperature of the supply air; and
a controller configured to perform the method of any of paragraphs C1-C24.

D1. A method of controlling the environment within an enclosed space, the method comprising:
supplying an air stream to an environmental control assembly adapted to control the physical properties of the air stream and produce a supply air stream;
supplying a portion of the supply air stream to the enclosed space to produce a return air stream;
returning a portion of the return air stream to the environmental control assembly; and
controlling the operation of the environmental control assembly based at least in part on a variable associated with the enclosed space.

D2. The method of paragraph D1, wherein the enclosed space includes a building.

D3. The method of paragraph D1, wherein the enclosed space includes a room.

D4. The method of any of paragraphs D1-D3, wherein the enclosed space comprises a data center.

D5. The method of paragraphs D1-D4, wherein the enclosed space contains equipment.

D6. The method of paragraph D5, wherein the equipment includes electronic equipment.

D7. The method of any of paragraphs D5-D6, wherein the enclosed space further includes an inlet region adapted to receive the supply air stream, and further wherein supplying the supply air stream to the enclosed space includes supplying the supply air stream to the inlet region.

D8. The method of paragraph D7, wherein the inlet region is in fluid communication with the equipment, and wherein the method further comprises supplying the supply air stream from the inlet region to the equipment to produce the return air stream.

D9. The method of paragraph D8, wherein the enclosed space further includes an exhaust region in fluid communication with the equipment and adapted to receive the return air stream, and further wherein returning the return air stream to the environmental control assembly includes supplying the return air stream from the exhaust region to the environmental control assembly.

D10. The method of paragraph D9, wherein the inlet region is not in fluid communication with the exhaust region.

D11. The method of paragraph D10, wherein the supply air stream passes through the equipment once before being returned to the environmental control assembly as the return air stream.

D12. The method of any of paragraphs D9-D11, wherein the supply air stream has a substantially horizontal flow path through the equipment.

D13. The method of any of paragraphs D1-D12, wherein the environmental control assembly is not contained within the enclosed space.

D14. The method of any of paragraphs D1-D13, wherein supplying the air stream includes supplying the air stream from outside the enclosed space.

D15. The method of any of paragraphs D1-D14, wherein supplying the air stream includes supplying the air stream from within the enclosed space.

D16. The method of any of paragraphs D1-D15, wherein the environmental control assembly includes a fluid drive assembly adapted to control the pressure of the air stream, and further wherein supplying the air stream to the environmental control assembly includes supplying the air stream to the fluid drive assembly to produce a pressure-controlled air stream.

D17. The method of paragraph D16, wherein the fluid drive assembly includes a fan.

D18. The method of paragraph D17, wherein the fan has a variable rotational frequency.

D19. The method of paragraph D18, wherein the variable associated with the enclosed space includes a pressure differential within the enclosed space, and wherein the method further includes measuring the pressure differential within the enclosed space and controlling the rotational frequency of the fan based at least in part on the pressure differential within the enclosed space.

D20. The method of any of paragraphs D9-D12, wherein the environmental control assembly includes a fan with a variable rotational frequency, and further wherein supplying the air stream to the environmental control assembly includes supplying the air stream to the variable rotational frequency fan to produce a pressure-controlled air stream.

D21. The method of paragraph D20, wherein the method further includes measuring an inlet pressure within the inlet region, measuring an exhaust pressure within the exhaust region, calculating an inlet to exhaust pressure difference between the inlet pressure and the exhaust pressure, and controlling the rotational frequency of the variable rotational frequency fan based at least in part on the inlet to exhaust pressure difference.

D22. The method of paragraph D21, wherein controlling the rotational frequency of the variable rotational frequency fan based at least in part on the inlet to exhaust pressure difference includes controlling the rotational frequency to maintain the inlet to exhaust pressure difference between a minimum threshold value and a maximum threshold value, D23. The method of paragraph D22, wherein the minimum threshold value is 0.01 inch WC, and the maximum threshold value is 1.0 inch WC.

D24. The method of any of paragraphs D21-D23, wherein the inlet pressure is greater than the exhaust pressure.

D25. The method of paragraph D24, wherein the inlet pressure is at least 0.05 inch WC greater than the exhaust pressure.

D26. The method of any of paragraphs D1-D25, wherein the environmental control assembly includes a temperature modulating assembly adapted to control the temperature of the air stream, and further wherein supplying the air stream to the environmental control assembly includes supplying the air stream to the temperature modulating assembly to produce a temperature controlled air stream at a target temperature.

D27. The method of paragraph D26, the method further including measuring an air temperature associated with the enclosed space and controlling the temperature of the temperature controlled air stream to control the air temperature associated with the enclosed space to a target temperature.

D28. The method of paragraph D27, wherein the target temperature is 70 to 78 degrees Fahrenheit.

D29. The method of paragraph D27, wherein the target temperature is 72 to 76 degrees Fahrenheit.

D30. The method of paragraph D27, wherein the target temperature is 74 degrees Fahrenheit.

D31. The method of any of paragraphs D26-D30, wherein the temperature modulating assembly includes a primary temperature modulating assembly, wherein the primary temperature modulating assembly includes an indirect evaporative cooler that includes a heat exchanger with a hot side and a cold side, and further wherein the method comprises supplying a scavenger air stream and a water stream in fluid communication with the scavenger air stream to the cold side of the heat exchanger, evaporating the water stream in the scavenger air stream to cool the cold side, supplying the air stream to the hot side of the heat exchanger, and cooling the air stream within the heat exchanger to produce a cooled air stream.

D32. The method of paragraph D31, wherein the primary temperature modulating assembly further includes an indirect evaporative cooler fan in fluid communication with the cold side of the heat exchanger, and further wherein supplying the scavenger air stream includes supplying the scavenger air stream with the indirect evaporative cooler fan.

D33. The method of paragraph D32, wherein the indirect evaporative cooler fan includes a variable rotational frequency indirect evaporative cooler fan, and further wherein cooling the air stream within the heat exchanger includes controlling the temperature of the air stream by varying the rotational frequency of the indirect evaporative cooler fan.

D34. The method of any of paragraphs D31-D33, wherein the temperature modulating assembly further includes a secondary temperature modulating assembly, and further wherein supplying the air stream to the temperature modulating assembly includes supplying the air stream to the primary temperature modulating assembly and the secondary temperature modulating assembly.

D35. The method of paragraph D34, wherein the method further comprises turning the secondary temperature modulating assembly on if the rotational frequency of the indirect evaporative cooler fan is greater than an upper indirect evaporative cooler fan rotational frequency threshold.

D36. The method of paragraph D35, wherein the indirect evaporative cooler fan has a maximum rotational frequency, and further wherein the upper indirect evaporative cooler fan rotational frequency threshold is 95% of the maximum rotational frequency.

D37. The method of any of paragraphs D34-D36, wherein the method further comprises turning the secondary temperature modulating assembly off if the rotational frequency of the indirect evaporative cooler fan is less than a lower indirect evaporative cooler fan rotational frequency threshold, D38. The method of paragraph D37, wherein the indirect evaporative cooler fan has a maximum rotational frequency, and further wherein the lower indirect evaporative cooler fan rotational frequency threshold is 70% of the maximum rotational frequency.

D39. The method of any of paragraphs D34-D38, wherein the air stream includes sensible heat and latent heat, and further wherein the secondary temperature modulating assembly is adapted to remove more sensible heat than latent heat from the air stream.

D40. The method of paragraph D39, wherein the secondary temperature modulating assembly includes dampers adapted to control the amount of latent heat removed from the air stream, and wherein the method further includes adjusting the amount of sensible heat removed from the air stream by adjusting the dampers.

D41. The method of any of paragraphs D34-D40, wherein the secondary temperature modulating assembly includes a direct expansion cooling system, and further wherein supplying the air stream to the secondary temperature modulating assembly includes supplying the air stream to the direct expansion cooling system.

D42. The method of any of paragraphs D34-D41, wherein the secondary temperature modulating assembly includes a cold water cooling system, and further wherein supplying the air stream to the secondary temperature modulating assembly includes supplying the air stream to the cold water cooling system.

D43. The method of any of paragraphs D35-D42, wherein the secondary temperature modulating assembly includes a plurality of independent stages, wherein turning on the secondary temperature modulating assembly includes turning on a stage of the secondary temperature modulating assembly, and, subsequent to turning on a stage of the secondary temperature modulating assembly, the method further includes waiting a predetermined period of time, determining if the rotational frequency of the indirect evaporative cooler fan is greater than an upper indirect evaporative cooler fan rotational frequency threshold, and turning on another stage of the secondary temperature modulating assembly if the rotational frequency of the indirect evaporative cooler fan is greater than an upper indirect evaporative cooler fan rotational frequency threshold.

D44. The method of any of paragraphs D35-D43, wherein the secondary temperature modulating assembly includes a plurality of independent stages, wherein turning off the secondary temperature modulating assembly includes turning off a stage of the secondary temperature modulating assembly, and the method further includes waiting a predetermined period of time, determining if the rotational frequency of the indirect evaporative cooler fan is less than a lower indirect evaporative cooler fan rotational frequency threshold, and turning off another stage of the secondary temperature modulating assembly if the rotational frequency of the indirect evaporative cooler fan is less than a lower indirect evaporative cooler fan rotational frequency threshold.

D45. The method of any of paragraphs D43-D44, wherein the predetermined period of time is 1 to 15 minutes.

D46. The method of paragraph D45, wherein the predetermined period of time is 5 minutes.

D47. The method of any of paragraphs D34-D46, wherein when the secondary temperature modulating assembly is on it is run continuously, and wherein the method further includes controlling the temperature of the air stream using the primary temperature modulating assembly.

D48. The method of any of paragraphs D34-D47, wherein the environmental control assembly has a cooling capacity, the enclosed space applies a heat load, and the method further includes matching the cooling capacity of the environmental control assembly to the heat load of the enclosed space to within 20%.

D49. The method of paragraph D48, wherein the matching is to within 10%.

D50. The method of paragraph D48, wherein the matching is to within 5%.

D51. The method of paragraph D48, wherein the matching is to within 1%.

D52. The method of any of paragraphs D1-D51, wherein the environmental control assembly further includes a humidification assembly adapted to control the humidity of the air stream, and further wherein supplying the air stream to the environmental control assembly includes supplying the air stream to the humidification assembly to produce a humidified air stream.

D53. The method of paragraph D52, wherein the humidification assembly includes a direct evaporative humidifier.

D54. The method of paragraph D53, wherein the method further comprises supplying a humidifying water stream to the direct evaporative humidifier, and further wherein the humidifying water stream is evaporated in the air stream to produce the humidified air stream.

D55. The method of paragraph D52, wherein the method further comprises controlling the humidity of the air stream to be between a minimum humidity threshold and a maximum humidity threshold.

D56. The method of paragraph D55, wherein the minimum humidity threshold is 20% relative humidity, and the maximum humidity threshold is 80% relative humidity with the air stream at 70 degrees Fahrenheit.

D57. The method of paragraph D55, wherein the minimum humidity threshold is 40% relative humidity and the maximum humidity threshold is 60% relative humidity with the air stream at 70 degrees Fahrenheit.

D58. The method of any of paragraphs D1-D57, wherein the environmental control assembly includes an extraction assembly adapted to remove undesired materials from the air stream, and further wherein supplying the air stream to the environmental control assembly includes supplying the air stream to the extraction assembly to produce a purified air stream.

D59. The method of paragraph D58, wherein the extraction assembly includes a mechanical particulate filter.

D60. The method of paragraph D58, wherein the extraction assembly includes an electronic particulate filter.

D61. The method of paragraph D60, wherein the electronic particulate filter includes an electrostatic particulate filter.

D62. The method of paragraph D58, wherein the extraction assembly includes a chemical filter.

D63. The method of any of paragraphs D1-D62, wherein the environmental control assembly includes a dehumidification assembly adapted to control the humidity of the air stream, and further wherein supplying the air stream to the environmental control assembly includes supplying the air stream to the dehumidification assembly to produce a dehumidified air stream.

D64. The method of paragraph D63, the method further comprising controlling the humidity of the air stream between a minimum humidity threshold and a maximum humidity threshold.

D65. The method of paragraph D64, wherein the minimum humidity threshold is 20% relative humidity, and further wherein the maximum humidity threshold is 80% relative humidity with the air stream at 70 degrees Fahrenheit.

D66. The method of paragraph D64, wherein the minimum humidity threshold is 40% relative humidity, and further wherein the maximum humidity threshold is 60% relative humidity with the air stream at 70 degrees Fahrenheit.

INDUSTRIAL APPLICABILITY

The disclosed environmental control systems and methods are applicable to data centers and other locations in which environmental controls such as temperature, pressure, and/or humidity are important.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A method of controlling an environment within an enclosed space, the method comprising:
supplying a supply air stream from an environmental control assembly to the enclosed space;
returning at least a portion of the supply air stream to the environmental control assembly as a return air stream;
controlling a temperature of the supply air stream with the environmental control assembly based at least in part on a temperature associated with the enclosed space;
detecting a pressure differential between a hot aisle of the enclosed space and a cold aisle of the enclosed space with a differential pressure sensor; and controlling a flow rate of the supply air stream with the environmental control assembly based at least in part on the pressure differential, wherein the enclosed space utilizes hot aisle containment to separate the hot aisle from the cold aisle, and further wherein the method includes maintaining a pressure in the hot aisle to be less than a pressure in the cold aisle.

2. The method of claim 1, wherein controlling the temperature of the supply air stream and controlling the flow rate of the supply air stream includes controlling the temperature of the supply air stream independently from controlling the flow rate of the supply air stream.

3. The method of claim 2, wherein controlling the temperature of the supply air stream independently from controlling the flow rate of the supply air stream includes controlling the temperature of the supply air stream without varying the flow rate of the supply air stream, and further wherein controlling the temperature of the supply air stream independently from controlling the flow rate of the supply air stream includes controlling the flow rate of the supply air stream without varying the temperature of the supply air stream.

4. The method of claim 1, wherein the environmental control assembly includes an indirect evaporative cooling assembly (IECA) that includes a variable rotational frequency IECA fan configured to provide an IECA scavenger air stream in fluid communication with an IECA water stream to indirectly cool the supply air stream, wherein controlling the temperature of the supply air stream includes controlling a rotational frequency of the variable rotational frequency IECA fan, wherein the method includes increasing the rotational frequency of the variable rotational frequency IECA fan responsive at least in part to the temperature associated with the enclosed space being greater than a threshold temperature, wherein the method further includes decreasing the rotational frequency of the variable rotational frequency IECA fan responsive to the temperature associated with the enclosed space being less than the threshold temperature, and further wherein the controlling the rotational frequency of the variable rotational frequency IECA fan is independent from the controlling the flow rate of the supply air stream.

5. The method of claim 4, wherein the environmental control assembly further includes a supplemental cooling assembly, wherein the supplemental cooling assembly includes at least one of a direct expansion cooling assembly and a cold water cooling assembly, and further wherein controlling the temperature of the supply air stream includes controlling the operation of the supplemental cooling assembly.

6. The method of claim 5, wherein the supplemental cooling assembly includes a plurality of supplemental cooling assemblies including at least a first supplemental cooling assembly and at least a second supplemental cooling assembly, and further wherein controlling the temperature of the supply air stream includes transitioning the first supplemental cooling assembly from a supplemental cooling assembly inactive state to a supplemental cooling assembly active state responsive at least in part to the rotational frequency of the variable rotational frequency IECA fan being greater than an IECA fan maximum rotational frequency threshold.

7. The method of claim 6, wherein controlling the temperature of the supply air stream includes transitioning the second supplemental cooling assembly from the supplemental cooling assembly inactive state to the supplemental cooling assembly active state responsive at least in part to the first supplemental cooling assembly being in the supplemental cooling assembly active state and the rotational frequency of the variable rotational frequency IECA fan being greater than the IECA fan maximum rotational frequency threshold.

8. The method of claim 7, wherein controlling the temperature of the supply air stream includes transitioning the second supplemental cooling assembly from the supplemental cooling assembly active state to the supplemental cooling assembly inactive state responsive at least in part to the first supplemental cooling assembly being in the supplemental cooling assembly active state and the rotational frequency of the variable rotational frequency IECA fan being less than an IECA fan minimum rotational frequency threshold.

9. The method of claim 8, wherein controlling the temperature of the supply air stream includes transitioning the first supplemental cooling assembly from the supplemental cooling assembly active state to the supplemental cooling assembly inactive state responsive at least in part to the second supplemental cooling assembly being in the supplemental cooling assembly inactive state and the rotational frequency of the variable rotational frequency IECA fan being less than the IECA fan minimum rotational frequency threshold.

10. The method of claim 1, wherein the environmental control assembly includes a variable rotational frequency fluid drive assembly configured to provide a motive force to the supply air stream and further wherein controlling the flow rate of the supply air stream includes increasing the flow rate of the air supply stream by increasing a rotational frequency of the variable rotational frequency fluid drive assembly responsive at least in part to the pressure differential between the hot aisle and the cold aisle being less than a threshold pressure differential and decreasing the flow rate of the air supply stream by decreasing the rotational frequency of the variable rotational frequency fluid drive assembly responsive at least in part to the pressure differential between the hot aisle and the cold aisle being greater than the threshold pressure differential.

11. The method of claim 1, wherein the supplying includes supplying the supply air stream to an intake region of the enclosed space, wherein the intake region includes the cold aisle, and further wherein the method includes:
cooling electronic equipment, which is present within the enclosed space, with the supply air stream by flowing the supply air stream from the intake region, through the electronic equipment, and to an exhaust region to generate an exhaust stream, wherein the exhaust region includes the hot aisle; and
fluidly separating the hot aisle from the cold aisle with a partition such that the supply air stream flows through the electronic equipment responsive to the pressure differential between the hot aisle and the cold aisle.

12. The method of claim 11, wherein the detecting includes detecting the pressure differential across the partition.

13. The method of claim 11, wherein the detecting includes detecting the pressure differential between the intake region and the exhaust region.

14. The method of claim 11, wherein the returning includes receiving the exhaust stream with an exhaust conduit and providing the exhaust stream to the environmental control assembly, via the exhaust conduit, as the return air stream, wherein the exhaust conduit fluidly separates the exhaust stream from the intake region.

15. An environmental control assembly, comprising:
a fluid drive assembly configured to control the flow rate of a supply air stream;
a cooling assembly configured to control the temperature of the supply air stream; and
a controller programmed to:
supply a supply air stream from an environmental control assembly to the enclosed space;

return at least a portion of the supply air stream to the environmental control assembly as a return air stream;

control the temperature of the supply air stream with the environmental control assembly based at least in part on a temperature associated with the enclosed space;

detect a pressure differential between a hot aisle of the enclosed space and a cold aisle of the enclosed space with a differential pressure sensor; and control the flow rate of the supply air stream with the environmental control assembly based at least in part on the pressure differential, wherein the enclosed space utilizes hot aisle containment to separate the hot aisle from the cold aisle, and further wherein a pressure in the hot aisle is maintained to be less than a pressure in the cold aisle.

* * * * *

UNITED STATES PATENT AND TRADEMARK OFFICE
CERTIFICATE OF CORRECTION

PATENT NO. : 9,204,578 B2  
APPLICATION NO. : 13/023346  
DATED : December 1, 2015  
INVENTOR(S) : Kenneth Lane Smith Page 1 of 1

It is certified that error appears in the above-identified patent and that said Letters Patent is hereby corrected as shown below:

In the claims

In Column 36, Line 24, please delete "air supply stream" and insert --supply air stream-- therefor.

In Column 36, Lines 29-30, please delete "air supply stream" and insert --supply air stream-- therefor.

Signed and Sealed this  
Tenth Day of May, 2016

Michelle K. Lee  
*Director of the United States Patent and Trademark Office*